(12) United States Patent
Atalar et al.

(10) Patent No.: US 11,287,498 B2
(45) Date of Patent: Mar. 29, 2022

(54) GRADIENT ARRAY SYSTEM FOR MRI AND APPLICATION ON DIFFUSION WEIGHTED IMAGING

(71) Applicant: Ihsan Dogramaci Bilkent Universitesi, Ankara (TR)

(72) Inventors: Ergin Atalar, Ankara (TR); Niyazi Koray Ertan, Ankara (TR); Soheil Taraghinia, Ankara (TR)

(73) Assignee: Ihsan Dogramaci Bilkent Universiti, Ankara (TR)

( * ) Notice: Subject to any disclaimer, the term of this patent is extended or adjusted under 35 U.S.C. 154(b) by 0 days.

(21) Appl. No.: 17/059,005

(22) PCT Filed: May 30, 2019

(86) PCT No.: PCT/TR2019/050405
§ 371 (c)(1),
(2) Date: Nov. 25, 2020

(87) PCT Pub. No.: WO2019/231427
PCT Pub. Date: Dec. 5, 2019

(65) Prior Publication Data
US 2021/0263118 A1 Aug. 26, 2021

Related U.S. Application Data

(60) Provisional application No. 62/838,752, filed on Apr. 25, 2019, provisional application No. 62/678,751, filed on May 31, 2018.

(51) Int. Cl.
*G01V 3/00* (2006.01)
*G01R 33/385* (2006.01)
*G01R 33/563* (2006.01)

(52) U.S. Cl.
CPC ..... *G01R 33/385* (2013.01); *G01R 33/56341* (2013.01)

(58) Field of Classification Search
CPC ............. G01R 33/5608; G01R 33/543; G01R 33/3815; G01R 33/3804; A61B 5/055
(Continued)

(56) References Cited

U.S. PATENT DOCUMENTS

2009/0067752 A1* 3/2009 Lee ...................... G06K 9/6203
382/294
2010/0102815 A1 4/2010 Parker et al.
(Continued)

FOREIGN PATENT DOCUMENTS

EP 1102079 A2 5/2001

OTHER PUBLICATIONS

International Search Report and Written Opinion, PCT/TR2019/050405, dated Sep. 19, 2019, 10 pages.

*Primary Examiner* — Walter L Lindsay, Jr.
*Assistant Examiner* — Frederick Wenderoth
(74) *Attorney, Agent, or Firm* — Nelson Mullins Riley & Scarborough LLP; Reza Mollaaghababa; Andrew W. Schultz

(57) ABSTRACT

In one aspect, in a magnetic resonance imaging system having a gradient coil array comprising a plurality of independent coils distributed about an enclosure, a method of applying currents to said coils is disclosed, which comprises defining a merit function for optimizing at least one feature of any of a magnetic field and an electric field generated by the coils, using a computer processor to optimize the merit function so as to determine an optimal current vector, wherein said element of the current vector provides a current value for application to one of said gradient coils, and applying the currents to said coils.

20 Claims, 16 Drawing Sheets

(58) Field of Classification Search
USPC .......................................................... 324/322
See application file for complete search history.

(56) References Cited

U.S. PATENT DOCUMENTS

| 2012/0235685 | A1* | 9/2012 | Abe ..................... | G01R 33/385 |
| | | | | 324/322 |
| 2016/0228702 | A1* | 8/2016 | Kempe ................ | A61N 1/0476 |
| 2018/0011156 | A1 | 1/2018 | Atalar et al. | |

* cited by examiner

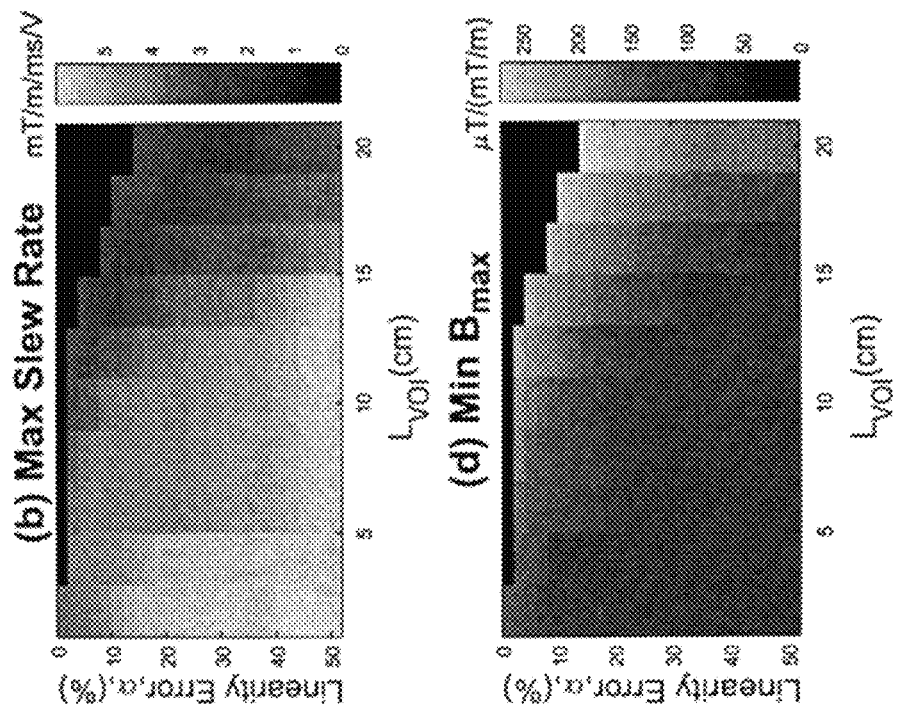
FIG. 9A
FIG. 9B
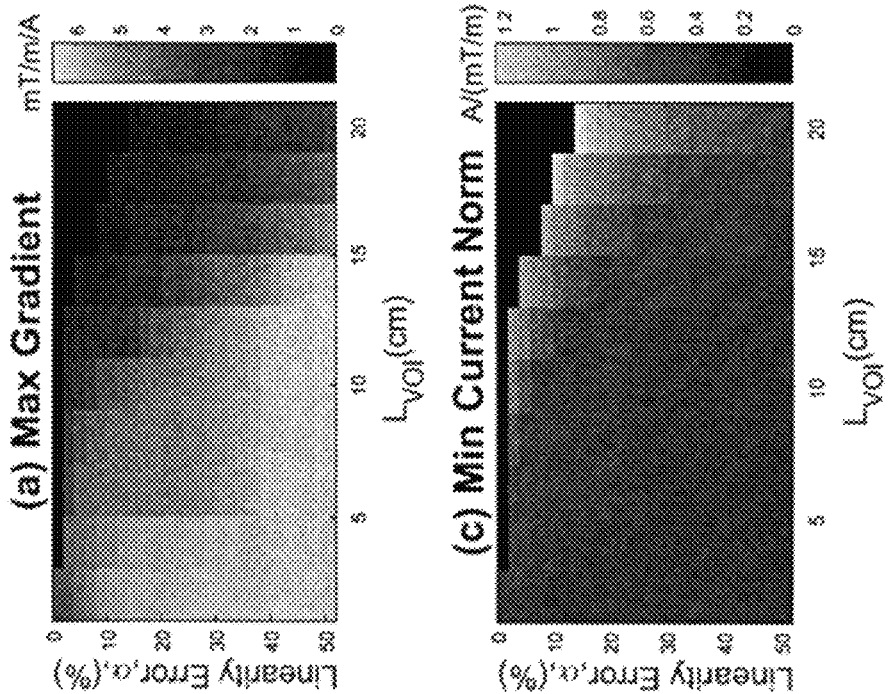
FIG. 9C
FIG. 9D

GRADIENT ARRAY SYSTEM FOR MRI AND APPLICATION ON DIFFUSION WEIGHTED IMAGING

RELATED APPLICATIONS

The present application is the National Stage of International Application No. PCT/TR2019/050405 filed on May 30, 2019, which claims the benefit of priority to U.S. Provisional Patent Application No. 62/838,752 filed on Apr. 25, 2019 and U.S. Provisional Patent Application No. 62/678,751 filed on May 31, 2018, all of which are hereby incorporated by reference in their entireties.

STATE OF ART

The present teachings are generally related to systems and methods for MRI imaging, and more particularly, to methods and systems that can be employed to optimize MRI imaging, particularly in MRI system comprising a plurality of independent magnetic gradient coils.

In magnetic resonance imaging (MRI) systems, three types of magnetic fields are conventionally utilized to obtain an image of an object. A first or primary magnetic field, termed the $B_0$ field is static in time and substantially homogeneous inside an imaging volume. The $B_0$ field typically determines a resonance frequency of the constituent atoms of the object being imaged, depending on the gyromagnetic ratios of the constituent atoms.

Further, to obtain an image of the object, the MRI system typically also generates a plurality of spatially modulated magnetic fields termed gradient fields. In conventional MRI scanners, three gradient coils, namely, x-gradient, y-gradient, and z-gradient, are used to encode three spatial modulated magnetic fields. Conventionally, an MM system drives each of the three gradient coils with a relatively high power amplifier. Systems that drive the gradient coils with separate amplifiers, each dedicated to one of the coils, are also known. For example, U.S. Patent Application No. 2018/0011156 entitled "Multi-purpose gradient array for magnetic resonance imaging," which is herein incorporated by reference in its entirety, discloses such a system.

There is still a need for enhanced methods and systems for MRI.

BRIEF DESCRIPTION OF THE INVENTION

In one aspect, in a magnetic resonance imaging system having a gradient coil array comprising a plurality of independent coils distributed about an enclosure, a method of applying currents to said coils is disclosed, which comprises defining a merit function for optimizing at least one feature of any of a magnetic field and an electric field generated by the coils, using a computer processor to optimize the merit function so as to determine an optimal current vector, wherein said element of the current vector provides a current value for application to one of said gradient coils, and applying the currents to said coils.

In some embodiments, a plurality of amplifiers are employed to apply the currents to the coils, where each amplifier is configured to apply the current associated with one of said coils to that coil.

In some embodiments, the feature to be optimized is the magnetic field gradient generated by the coils in a volume of interest (VOI), e.g., a volume in which at least a portion of an object is disposed for obtaining a magnetic resonance image thereof. The magnetic field gradient can be defined along a longitudinal axis of the coils, or along a transverse axis thereof In some embodiments, the optimization (typically maximization) of the magnetic field gradient corresponds to optimizing the magnetic field gradient per unit current applied to the coils. By way of example, the optimization can result in maximizing the magnetic field gradient at one or more locations within the volume of interest (VOI), e.g., at the center of the VOL In some embodiments, the step of maximizing the gradient field strength further comprises constraining the gradient field strength over the volume of interest to a value defined at a reference location with that volume.

The volume of interest (VOI) can be dynamically defined. For example, the VOI for one scan can be different from the VOI for another scan. Further, in some embodiments, even the different gradient pulses applied to the coils within a single scan can have different VOIs. In other words, in such embodiments, the VOI can be determined independently for each gradient pulse.

In some embodiments, the optimization of the gradient field strength comprises solving the following optimization relation:

$$\min_I -G_{cent}^T I$$

$$\begin{bmatrix} (1-\alpha_0) 1 G_{cent}^T - G^T \\ G^T - (1+\alpha_0) 1 G_{cent}^T \end{bmatrix} I \leq 0$$

$$\|I\|_\infty \leq 1$$

wherein,
I is a column vector containing current values for application to the coils,
1 is a column vector of ones,
G is a matrix of normalized gradient strength values for a selected number of observation locations in each of said coils for unit coil currents,
$G_{cent}^T$ is a column vector containing normalized magnetic gradient strengths at the centers of said coils for unit coil currents, and
$\alpha_0$ represents a constraint imposed on the gradient field strength though said volume of interest.

Alternatively or in addition, the gradient field linearity can be optimized in a VOL In some such embodiments, the optimization of the gradient field linearity comprises minimizing gradient field deviation at a plurality of locations within a VOI relative to the gradient field strength at a reference location within that volume, e.g., at the center of that volume.

In some embodiments, the optimization of the gradient field strength comprises solving the following linear optimization relations:

$$\min_{I,\varepsilon} [0 \ 1] \begin{bmatrix} I \\ \varepsilon \end{bmatrix}$$

$$\begin{bmatrix} G^T & -1 \\ -G^T & -1 \end{bmatrix} \begin{bmatrix} I \\ \varepsilon \end{bmatrix} \leq \begin{bmatrix} 1 \\ -1 \end{bmatrix}$$

$$[G_{cent}^T \ 0] \begin{bmatrix} I \\ \varepsilon \end{bmatrix} = 1$$

wherein,

I is a column vector containing current values for application to the coils,

G is a matrix of normalized gradient strength values for a selected number of observation locations in each of said coils for unit coil currents, $G_{cent}^T$ is a column vector containing normalized magnetic gradient strengths at the centers of said coils for unit coil currents, and ε is normalizing variable providing an upper limit for the linearity error.

In other embodiments, the magnetic field slew rate (i.e., the temporal rate of change of the magnetic field) can be optimized (e.g., maximized). For example, the slew rate can be maximized by minimizing a rise time associated with the current vector for a unit (i.e., 1 volt) amplifier voltage limit. In some embodiments, the step of minimizing a rise time associated with the current vector comprises minimizing a maximum value of the rise time associated with the coils. In some embodiments, the step of minimizing the rise time associated with the current vector comprises minimizing a rise time associated with one of the coils to which a maximum voltage is applied. In other words, for a given current vector, the channel (coil) with the maximum voltage demand will limit the rise time if the amplifiers' maximum voltage limits are the same.

In some embodiments, the step of minimizing the rise time ($\Delta t_{min}$) comprises solving the following linear optimization relations:

$$\min_I \Delta t_{min} = \min_I \|MI\|_\infty$$

$$|(G^T - 1 G_{cent}^T)I| \le \alpha_0 |1 G_{cent}^T I|$$

$$G_{cent}^T I = 1,$$

where,

I is a column vector containing current values for application to the coils,

M is a matrix containing elements corresponding to self and mutual inductive couplings of said plurality of coils, G is a matrix of normalized gradient strength values for a selected number of observation locations in each of said coils for unit coil currents, and $G_{cent}^T$ is a column vector containing normalized magnetic gradient strengths at the centers of said coils for unit coil currents.

In some embodiments, a method according to the present teachings is employed to optimize the square of the norm of the current vector. In many embodiments, such optimization can include minimizing the square of the current norm for a unit magnetic gradient strength within the volume of interest (VOI). In some embodiments, such minimization of the square of the current norm is achieved while constraining a maximum field gradient error below a selected threshold.

In some embodiments, the minimization of the square of the current norm comprises solving the following linear optimization relations:

$$\min_I \|I\|_2^2$$

$$\begin{bmatrix} (1-\alpha_0)1G_{cent}^T - G^T \\ G^T - (1+\alpha_0)1G_{cent}^T \end{bmatrix} I \le 0$$

$$G_{cent}^T I = 1,$$

wherein,

I is a column vector containing current values for application to the coils,

M is a matrix containing elements corresponding to self and mutual inductive couplings of said plurality of coils, G is a matrix of normalized gradient strength values for a selected number of observation locations in each of said coils for unit coil currents, and $G_{cent}^T$ is a column vector containing normalized magnetic gradient strengths at the centers of said coils for unit coil currents, and $\alpha_0$ represents a constraint imposed on the gradient field strength though said volume of interest.

In some embodiments, the methods of the present teachings can be employed to minimize the maximum amplitude of a vector B-field within a volume containing the volume of interest. In some embodiments, such minimization can be achieved by minimizing the maximum amplitude of a vector B-field within a volume containing the VOI while concurrently maximizing magnetic field gradient strength in the VOI so as to reduce the risk of peripheral nerve stimulation (PNS).

The maximum amplitude of the vector B-field ($B_{max}$) can be defined in accordance with the following relation:

$$B_{max} = \max_r |\Sigma_{i=1}^N B_i(r)I_i|,$$

where, $B_i(r)$ represents three-dimensional magnetic field vector associated with the $i^{th}$ coil at a plurality of locations (r) in said volume of interest, and $I_i$ is the current associated with the $i^{th}$ coil.

In some embodiments, the step of minimizing said maximum amplitude of the vector B-field comprises solving the following optimization relations:

$$\min_I B_{max}$$

$$\begin{bmatrix} (1-\alpha_0)1G_{cent}^T - G^T \\ G^T - (1+\alpha_0)1G_{cent}^T \end{bmatrix} I \le 0$$

$$G_{cent}^T I = 1,$$

where,

I is a column vector containing current values for application to the coils,

M is a matrix containing elements corresponding to self and mutual inductive couplings of said plurality of coils, G is a matrix of normalized gradient strength values for a selected number of observation locations in each of said coils for unit coil currents, $G_{cent}^T$ is a column vector containing normalized magnetic gradient strengths at the centers of said coils for unit coil currents, and $\alpha_0$ represents a constraint imposed on the gradient field strength though said volume of interest.

In some embodiments, the methods according to the present teachings are employed to obtain an optimal current vector by constraining maximum of an electric field generated in a volume containing a volume of interest below a threshold so as to inhibit peripheral nerve stimulation (PNS) of a patient disposed at least partially in said volume.

In some embodiments, the threshold associated with the PNS can be determined by utilizing at least one human body and at least one nerve model. In some embodiments, the threshold associated with the PNS can be determined by utilizing a neural activation model. Further, in some embodiments, voltage distribution induced on nerves can be utilized to estimate PNS characteristics.

In some embodiments, the merit function can be defined for concurrent optimization of two or more of the following features: gradient field strength per unit current, gradient field linearity, magnetic field slew rate, the square of the norm of current vector, amplitude of the vector B-field, amplitude of the vector E-field, power dissipation, thermal heating, and/or acoustic energy.

In some embodiments, the magnetic field gradients are configured so as to obtain a diffusion image of at least a portion of a subject's tissue disposed in the volume of interest. Further, in some embodiments, the present teachings can be employed to generate motion encoding gradients, which are used in Magnetic Resonance Elastography (MRE).

In a related aspect, a system for magnetic resonance imaging (MRI) is disclosed, which comprises a gradient coil array comprising a plurality of independent coils distributed about an enclosure, a controller configured to actuate said plurality of gradient coils to generate a magnetic field within a volume of interest, wherein said controller is configured to optimize a merit function defined for optimizing at least one feature of any of a magnetic field and an electric field generated by the gradient coils so as to determine an optimal current vector containing current values for application to said coils. The system can further include a plurality of amplifiers in communication with said controller, where each of said amplifiers is electrically coupled to one of the gradient coils, and where the controller effects each of said amplifiers to apply a current defined by said current vector for a coil associated with said amplifier to said coil.

In some embodiments of the above system, the feature to be optimized comprises a magnetic field gradient generated by said coils in a volume of interest (VOI). The magnetic field gradient is defined along a longitudinal axis of said coils. Alternatively, the magnetic field gradient is defined along a transverse axis of said coils. In some embodiments, the magnetic field gradient strength per unit current is optimized.

In some embodiments, the controller is configured to maximize the gradient field strength while constraining the gradient field strength over the VOI to a value thereof at a reference location within said VOI.

In some embodiments, the controller is configured to solve the following linear optimization relation for maximizing the gradient field strength:

$$\min_I -G_{cent}^T I$$

$$\begin{bmatrix} (1-\alpha_0)1 G_{cent}^T - G^T \\ G^T - (1+\alpha_0)1 G_{cent}^T \end{bmatrix} I \leq 0$$

$$\|I\|_\infty \leq 1$$

wherein,
I is a column vector containing current values for application to the coils,
1 is a column vector of ones,
G is a matrix of normalized gradient strength values for a selected number of observation locations in each of said coils for unit coil currents, $G_{cent}^T$ is a column vector containing normalized magnetic gradient strengths at the centers of said coils for unit coil currents, and
$\alpha_0$ represents a constraint imposed on the gradient field strength though said volume of interest.

In some embodiments, the controller is configured to optimize said gradient field linearity by minimizing gradient field strength deviation at a plurality of locations within the VOI relative to a gradient field strength at a reference location within said VOI.

In some embodiments, the controller is configured to optimize said gradient field linearity by solving the following relations:

$$\min_{I,\varepsilon} [0\ 1] \begin{bmatrix} I \\ \varepsilon \end{bmatrix}$$

$$\begin{bmatrix} G^T & -1 \\ -G^T & -1 \end{bmatrix} \begin{bmatrix} I \\ \varepsilon \end{bmatrix} \leq \begin{bmatrix} 1 \\ -1 \end{bmatrix}$$

$$[G_{cent}^T\ 0] \begin{bmatrix} I \\ \varepsilon \end{bmatrix} = 1$$

wherein,
I is a column vector containing current values for application to the coils,
G is a matrix of normalized gradient strength values for a selected number of observation locations in each of said coils for unit coil currents,
$G_{cent}^T$ is a column vector containing normalized magnetic gradient strengths at the centers of said coils for unit coil currents, and
$\varepsilon$ is a normalization variable providing an upper limit for the linearity error.

In some embodiments, the controller is configured to maximize magnetic field slew rate. For example, the controller is configured to maximize the magnetic field slew rate by minimizing a rise time associated with said current vector for a unit (1 V) amplifier voltage limit. In some such embodiments, the controller is configured to minimis the rise time by minimizing a maximum value of the rise time associated with the coils. For example, the controller can be configured to minimize the rise time ($\Delta t_{min}$) by solving the following relations:

$$\min_I \Delta t_{min} = \min_I \|MI\|_\infty$$

$$|(G^T - 1 G_{cent}^T)I| \leq \alpha_0 |1 G_{cent}^T I|$$

$$G_{cent}^T I = 1,$$

wherein,
I is a column vector containing current values for application to the coils,
M is a matrix containing elements corresponding to self and mutual inductive couplings of said plurality of coils,
G is a matrix of normalized gradient strength values for a selected number of observation locations in each of said coils for unit coil currents, and
$G_{cent}^T$ is a column vector containing normalized magnetic gradient strengths at the centers of said coils for unit coil currents.

In some embodiments, the controller is configured to minimize the square of the norm of the current vector within a volume of interest. For example, the controller can be configured to solve the following relations for minimizing the square of the current norm:

$$\min_I \|I\|_2^2$$
$$\begin{bmatrix} (1-\alpha_0)1G_{cent}^T - G^T \\ G^T - (1+\alpha_0)1G_{cent}^T \end{bmatrix} I \leq 0$$
$$G_{cent}^T I = 1,$$

wherein,

I is a column vector containing current values for application to the coils,

M is a matrix containing elements corresponding to self and mutual inductive couplings of said plurality of coils, G is a matrix of normalized gradient strength values for a selected number of observation locations in each of said coils for unit coil currents, and $G_{cent}^T$ is a column vector containing normalized magnetic gradient strengths at the centers of said coils for unit coil currents, and $\alpha_0$ represents a constraint imposed on the gradient field strength though said volume of interest.

In some embodiments, the controller is configured to minimize maximum amplitude of a vector B-field within a volume containing a volume of interest (VOI). For example, controller is configured to minimize maximum amplitude of a vector B-field within said volume while concurrently maximizing magnetic field gradient strength in said VOI so as to reduce risk of peripheral nerve stimulation (PNS). The maximum amplitude of the vector B-field ($B_{max}$) is defined in accordance with the following relation:

$$B_{max} = \max_r |\Sigma_{i=1}^N B_i(r) I_i|,$$

wherein, $B_i(r)$ represents three-dimensional magnetic field vector associated with the $i^{th}$ coil at a plurality of locations (r) in said volume of interest, $I_i$ is the current associated with the $i^{th}$ coil.

In some embodiments, the controller is configured to solve the following relations to minimize the maximum amplitude of the vector B-field:

$$\min_I B_{max}$$
$$\begin{bmatrix} (1-\alpha_0)1G_{cent}^T - G^T \\ G^T - (1+\alpha_0)1G_{cent}^T \end{bmatrix} I \leq 0$$
$$G_{cent}^T I = 1,$$

wherein,

I is a column vector containing current values for application to the coils,

M is a matrix containing elements corresponding to self and mutual inductive couplings of said plurality of coils, G is a matrix of normalized gradient strength values for a selected number of observation locations in each of said coils for unit coil currents, and $G_{cent}^T$ is a column vector containing normalized magnetic gradient strengths at the centers of said coils for unit coil currents.

$\alpha_0$ represents a constraint imposed on the gradient field strength though said volume of interest.

In some embodiments, the controller is configured to obtain said current vector by constraining maximum of electric field generated in a volume containing a volume of interest below a threshold so as to inhibit peripheral nerve stimulation (PNS) of a patient disposed at least partially in said volume. By way of example, the controller can determine the threshold by utilizing a neural activation model. In some embodiments, the controller can be configured to account for E-fields induced on the nerves to calculate the voltages and the resulting neural activation.

In some embodiments, the controller is configured to concurrently optimize two or more of the following features: gradient field strength per unit current, gradient field linearity, magnetic field slew rate, the square of the norm of current vector, maximum amplitude of vector B-field, and maximum amplitude of vector E-field, heating and or acoustic energy. For example, minimizing the current norm can decrease power dissipation and hence heating, and minimizing the slew rate can decrease acoustic energy generation.

In some embodiments, the controller is configured to determine the current vector such that magnetic field gradients generated by said coils are suitable for obtaining a diffusion image of at least a portion of a subject's tissue disposed in a volume of interest. These gradients can be used as diffusion encoding gradients to provide desired b-values.

In some embodiments, the controller is configured to optimizing the magnetic field gradient strength so as to decrease diffusion encoding duration, thereby increasing signal-to-noise ratio of DWI.

In some embodiments, the controller is configured to use a model of mutual inductances between the coils to determine voltages for inducing said currents in the coils.

Further understanding of various aspects of the invention can be obtained by reference to the following detailed description in conjunction with the drawings, which are briefly described below.

DESCRIPTION OF THE FIGURES

FIGS. 9A, 9B, 9C, and 9D show optimization results for four different optimization problems that maximize the gradient strength per unit amplifier current limit (A), slew rate per unit amplifier voltage limit (B), minimizes the norm of the gradient array currents per 1 mT/m gradient strength at the center (C), and maximizes amplitude of the vector B-field inside a Bmax computation domain in FIGS. 2A/2B per 1 mT/m gradient strength at the center of the VOI (D)

REFERENCE NUMBERS

Figure 1:
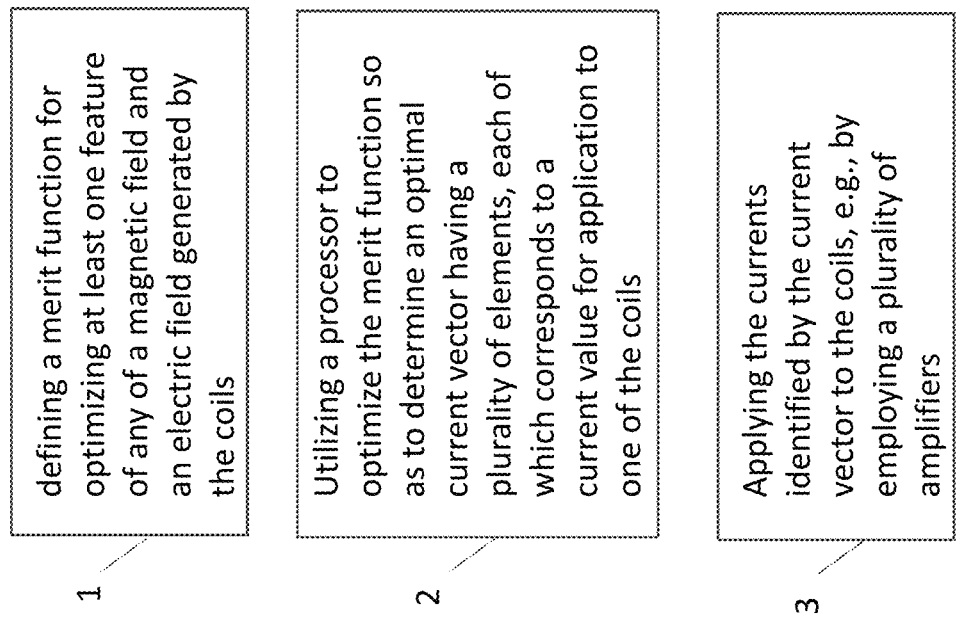
FIG. 1 is a flow chart depicting various steps in an embodiment of a method according to the present teachings for applying current to magnetic gradient coils of an MRI apparatus, FIGS. 2A and 2B schematically illustrate a nine-channel z-gradient array for a cylindrical volume of interest (VOI) and an ellipsoid VOI, respectively, FIG. 3 schematically depicts a magnetic resonance imaging (MRI) system in accordance with an embodiment of the present teachings.

1. Defining a merit function for optimizing at least one feature of any of a magnetic field and an electric field generated by the coils (step 1)
2. Utilizing a processor to optimize the merit function so as to determine an optimal current vector having a plurality of elements, each of which corresponds to a current value for application to one of the coils (step 2)
3. Applying the currents identified by the current vector to the coils, e.g., by employing a plurality of amplifiers (step 3)
10. Magnetic resonance imaging system (MRI System)
12. Magnetic field generator
14. Object
20. Gantry
22. Main magnet
24. Gradient coil array
26. RF coil
28. Table
30. Bore
32. Longitudinal axis
40. Monitoring unit
45. Amplifiers
50. Controller
50a. Processor
50b. Random access memory (RAM)
50c. Permanent memory
50e. Communication module
51. Excitation sources
52-1. First gradient coils
52. Independent coil
52-N. $N^{th}$ gradient coils
54. Shell
54a. Enclosure
55. Shield
60. Set of cables
61. Filter apparatus
62. Excitation signal
64. Excitation signal database

DETAILED DESCRIPTION OF THE INVENTION

In some aspects, the present invention provides methods and systems for optimizing the performance of an MRI system. The embodiments discussed below, the present teachings are described in connection with an MRI system that includes a plurality of magnetic gradient coils that are independently driven by a plurality of independent amplifiers. It should, however, be understood that the present teachings can also be employed in other MM systems. Further, as discussed in more detail below, the present teachings can be employed in different MRI modalities. For example, in some embodiments, the present teachings can be employed in obtaining tissue diffusivity images.

Various terms are used herein in accordance with their ordinary meanings in the art. By way of example, the magnetic field gradient refers to the derivative of the magnetic field along a direction. For example, the magnetic field gradient along a longitudinal axis of the coils (herein referred to as the z-axis in an xyz coordinate system) can be defined in accordance with the following relation:

$$G = \frac{\partial B_z}{\partial z} \qquad \text{Eq. (1)}$$

The magnetic field gradient along transverse directions, e.g., x or y, direction can be similarly defined.

The peak value of the magnetic field gradient linearity error (α) over a volume of interest (VOI) can be defined as follows:

$$\alpha = \max_{x,y,z} \left| \frac{G_z(x, y, z) - G_{ref}(x_{ref}, y_{ref}, z_{ref})}{G_z(x_{ref}, y_{ref}, z_{ref})} \right| \qquad \text{Eq. (2)}$$

where,
$G_z(x, y, z)$ represents the magnetic field gradient along the z-axis at a location characterized by points (x,y,z), and $G_z(x_{ref}, y_{ref}, z_{ref})$ represents the magnetic field gradient at a reference location having coordinates $(x_{ref}, y_{ref}, z_{ref})$.

Although the above relation of the peak gradient linearity error is defined for a magnetic field gradient along the z direction, a similar relation can be defined for the peak gradient linearity error in any of the transverse directions (i.e., x and y directions).

The term "slew rate," as used herein, refers to the rate of the change of the magnitude of the gradient of the magnetic field (B) as a function of time:

$$\text{Slew rate} = \frac{\partial G}{\partial t} \qquad \text{Eq. (3)}$$

With reference to the flow chart of FIG. 1, a method according to the present teachings for applying currents to a plurality of independent coils distributed about an enclosure, comprising defining a merit function for optimizing at least one feature of any of a magnetic field and an electric field generated by the coils (step 1) (1). A computer processor can be used to optimize the merit function so as to determine an optimal current vector having a plurality of elements, each of which corresponds to a current value for application to one of the coils (step 2) (2). The currents identified by the current vector can then be applied to the coils (step 3) (3), e.g., by employing a plurality of amplifiers The one or more features of the magnetic and/or electric field that can be optimized via optimization of the merit function can be include any feature(s) of interest. For example, as discussed in more detail below, in some embodiments, such a feature can include at least one of magnetic field gradient strength, slew rate, square of the current norm, peak vector B field, electric field, power dissipation, thermal energy, neural activation function to reduce risk of PNS, among others. In some embodiments, two, several, or all of the these features, can be optimized concurrently. In some embodiments, one or more of the features can be optimized while one or more of the other features are constrained.

By way of example, the feature can be any of a magnetic field gradient strength, magnetic field gradient linearity, slew rate, the square of the current norm, peak B-field vector, peak E-field vector, among others.

In some embodiments, the optimization of one or more of these features is achieved while imposing a constraint on one or more of the other features. By way of example, the magnetic field gradient strength within a volume of interest can be maximized while ensuring that deviations in the linearity of the magnetic field gradient within the volume remains below a given threshold. By way of another example, the square of current norm can be minimized while ensuring that peak error in linearity of the magnetic field gradient is constrained at a given value throughout the volume of interest.

As discussed in more detail below, the teachings of the present invention can be utilized in different modalities of magnetic resonance imaging, e.g., in diffusion imaging.

Figures 2A, 2B:
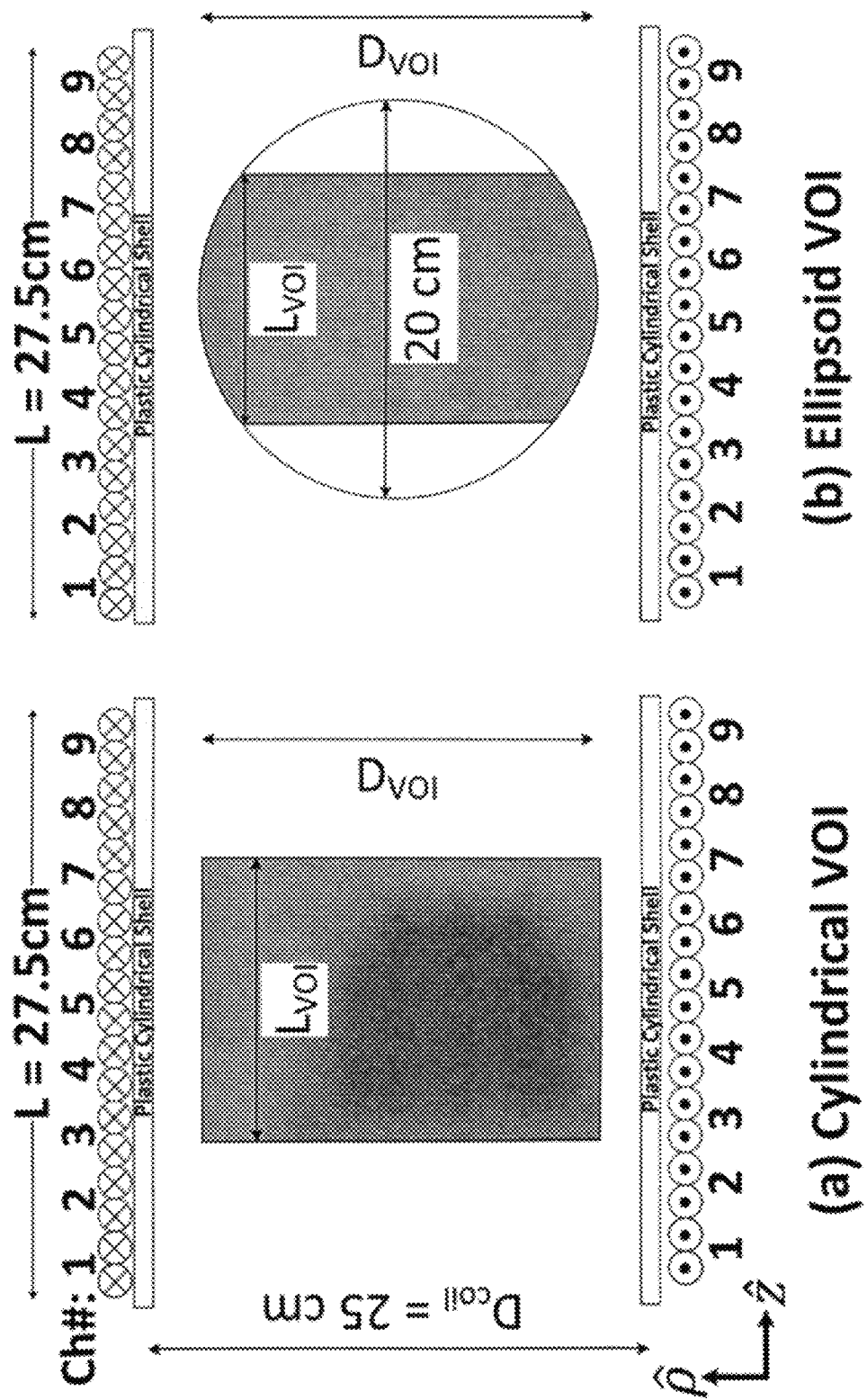

Without any loss of generality and simply for ease of illustration, in the following discussion, gradient array performances are analyzed and optimized for two types of volume of interest, namely, a cylindrical volume and a truncated ellipsoid volume with free parameters of length ($L_{VOI}$) and transverse diameter ($D_{VOI}$) of volume of interest (VOI) as shown in FIG. 2A and FIG. 2B, respectively. It should, however, be understood that the present teachings are not limited to a specific shape of the VOI, but rather can be applied to a variety of VOI shapes and configuration. The cylindrical and truncated ellipsoid shapes are chosen only for illustrating various aspects of the present teachings, and are not intended to limit to those teachings to specific shapes of the VOI.

In the following discussion, the peak value of the gradient field linearity error over the entire VOI, designated as $\alpha$ is defined in accordance with the following relation:

$$\alpha = \max_{\rho, z} \left| \frac{G_z(\rho, z) - G_z(0, 0)}{G_z(0, 0)} \right| \qquad \text{Eq. (4)}$$

where $G_z(\rho,z)$ represents the gradient field strength at a location within the volume of interest characterized by coordinates $\rho,z$. $G_z(0,0)$ represents the magnetic field gradient strength at the center of the volume of interest. (Eq. (4) is a special form of Eq. (2), where the center of the VOI is selected as the reference location). The choice of the center of the VOI as the reference location for defining the peak value of the gradient linearity error is arbitrary and is merely for ease of discussion. In general, any other location within the VOI can be selected as a reference location for defining the peak value of the gradient linearity error. Further, other functions defining gradient field linearity error can also be employed in the practice of the present teachings.

Without any loss of generality, in the following embodiments, the time dependency of the gradient fields and currents are ignored assuming that gradient fields are spatiotemporally separable.

I. Minimum Peak Linearity Error

Nonlinearity in gradient fields can result in undesired encoding of the object and image artifacts. Even in basic sequences, gradient nonlinearity can cause variations in the voxel size. Although there are post-processing algorithms for homogenizing the image resolution are known, the signal-to-noise ratio (SNR) can become nonuniform on the image after application of such post-processing algorithms. In the excitation part, gradient nonlinearity can cause excitation of curved slices, which is more challenging to correct in the post-processing stage.

Therefore, gradient linearity is a desirable parameter inside a VOI for most conventional pulse sequences. However, some gradient linearity might be sacrificed to gain performance advantage from other parameters. Dynamic adjustment of gradient linearity can enable optimizing the tradeoff between gradient linearity and other gradient performance metrics depending on the sequence requirements.

When the magnetic field gradient strength at the center of VOI is defined as unity, the denominator in the above Eqs. (2 and 4) can be removed. Since $\alpha$ is independent of scaling of I (current), this algebraic manipulation can be performed without any loss of generality. The following linear programming problem can be formulated to minimize $\alpha$ inside the VOI in accordance with the following relations:

$$\min_I \|G^T I - 1\|_\infty$$

$$G_{cent}^T I = 1 \qquad \text{Eq. (5)}$$

In the above relations, I denotes a column vector of currents, where each current is intended for application to one of the coils, 1 is a column vector of ones, G is a matrix of normalized gradient strength. The dimension of G is dictated by the number of coils and the number of observation points in a volume of interest. For example, in one embodiment in which there are 9 coils and N observation points, G has a dimension of 9×N. $G_{cent}^T$ is a column vector for the normalized gradient strength at the center for unit coil currents. In the following discussion, and without any loss of generality, both G and $G_{cent}^T$ are normalized with the same normalization factor such that their infinity norm is 1. $G_{cent}^T I$ is the summation of gradient strengths provided by each channel (i.e., each independent coil) at the center of VOI weighted by the current vector. Similarly, $G^T I$ is the summation of gradient strengths provided by each channel at N observation points weighted by the current vector, that is, the field profiles of all of the channels (coils) are superposed by currents applied to those channels (current weights).

The minimization of the peak gradient linearity error discussed in this section is rendered consistent with the definition of $\alpha$ by assuming that the gradient strength at the center of the VOI is unity since scaling of I does not influence α. Optimization problem of minimizing the infinity norm with linear constraints can be expressed as in Eq. (6) with inserting a normalization variable E. Since in this section the optimization problem aims to minimize the peak linearity error at all pixels, the optimization problem can be converted into minimization of the normalization variable that acts as an upper bound for linearity error. In this manner, a more conventional structure of a linear programming problem can be obtained as follows:

$$\min_{I,\varepsilon} \varepsilon,$$

$$\|G^T I - 1\|_\infty \leq \varepsilon,$$

$$G_{cent}^T I = 1 \qquad \text{Eq. (6)}$$

From the above Eq. (6), a new set of variables and constraints can be defined to set up an appropriate linear programming problem as shown in Eq. (7) below. Inequality constraint is reordered to remove the absolute value and to obtain a proper inequality constraint as follows:

$$\min_{I,\varepsilon} [0\ 1] \begin{bmatrix} I \\ \varepsilon \end{bmatrix} \qquad \text{Eq. (7)}$$

$$\begin{bmatrix} G^T & -1 \\ -G^T & -1 \end{bmatrix} \begin{bmatrix} I \\ \varepsilon \end{bmatrix} \leq \begin{bmatrix} 1 \\ -1 \end{bmatrix}$$

$$[G_{cent}^T\ 0] \begin{bmatrix} I \\ \varepsilon \end{bmatrix} = 1$$

I. Maximum Gradient Strength

Higher gradient strengths are generally desirable in magnetic resonance imaging (MRI) since they can provide greater phase or frequency variation throughout the object. Higher gradient strengths can be used, for example, for enhanced image resolution, decreased scan time, decreased RF pulse durations, decreased TE, robustness to some image artifacts, such as $B_0$ inhomogeneity and motion artifacts, and increased SNR (signal-to-noise ratio).

The following linear programming relations can be defined and solved to maximize the magnetic field gradient strength at the center of a VOI:

$$\min_I -G_{cent}^T I \qquad \text{Eq. (8)}$$

$$\begin{bmatrix} (1-\alpha_0)1 G_{cent}^T - G^T \\ G^T - (1+\alpha_0)1 G_{cent}^T \end{bmatrix} I \leq 0$$

$$\|I\|_\infty \leq 1$$

II. Maximum Slew Rate

Slew rate limits are generally determined by amplifier voltage limitations and peripheral nerve stimulation (PNS) due to fast gradient switching. High slew rates are desirable in MRI for a variety of applications. For example, echo spacing in echo planar imaging (EPI) is generally determined by the slew rate limits of the gradient system. Lower echo spacing decreases the time interval for each echo, which in turn provides decrease TE as well as increased robustness to $B_0$ inhomogeneity and patient motion. For a required gradient strength, slew rate can be maximized by minimizing the rise time of the current vector. The rise time of a gradient coil current is limited by the amplifier voltage. In an array configuration, a channel with maximum voltage demand determines the minimum attainable rise for the same gradient waveform for all channels except for the amplitude of the waveform.

Without loss of generality, in this section, coil resistances are ignored for simplicity since the peak voltage required for the gradient coils are generally dominated by the inductive part of the impedance. However, it should be understood that the present teachings including various mathematical relations disclosed herein can be used and in some cases readily modified, to take into account the coil resistances. For example, Equation (22) below takes into account resistances of the coils. As such, the assumption with respect to ignoring the coil resistances in not limiting of the scope of the invention. Thus, the required coil voltage vector (V) for each channel for a given current amplitude vector (I), rise time (Δt) and mutual coupling matrix, M, can be expressed as V=MI/Δt. The mutual coupling matrix M is described in more detail below in Appendix A.

Therefore, the optimization problem is formulated to minimize the maximum value of the rise time among the cannels for a given current vector for a unit amplifier voltage and a unit gradient strength at the center. In many embodiments, the peak linearity error can also be limited by $\alpha_0$. The following relations can be solved for minimizing the maximum value of the rise time:

$$\min_I \Delta t_{min} = \min_I \|MI\|_\infty$$

$$|(G^T - 1 G_{cent}^T) I| \leq \alpha_0 |1 G_{cent}^T I|$$

$$G_{cent}^T I = 1, \qquad \text{Eq. (9)}$$

wherein,

I is a column vector containing current values for application to the coils,

M is a matrix containing elements corresponding to self and mutual inductive couplings of said plurality of coils, G is a matrix of normalized gradient strength values for a selected number of observation locations in each of said coils for unit coil currents, and $G_{cent}^T$ is a column vector containing normalized magnetic gradient strengths at the centers of said coils for unit coil currents.

Similar to the optimization of the linear error, the above optimization relations can be converted into formal linear programming relations by inserting a dummy variable $\Delta t_{min}$ as follows:

$$\min_{I,\Delta t_{min}} [0\ 1] \begin{bmatrix} I \\ \Delta t_{min} \end{bmatrix} \qquad \text{Eq. (10)}$$

$$\begin{bmatrix} \begin{bmatrix} (1-\alpha_0)1 G_{cent}^T - G^T \\ G^T - (1+\alpha_0)1 G_{cent}^T \end{bmatrix} & 0 \\ M_{9\times 9} & -1 \\ -M_{9\times 9} & -1 \end{bmatrix} \begin{bmatrix} I \\ \Delta t_{min} \end{bmatrix} \leq 0$$

$$[G_{cent}^T\ 1] \begin{bmatrix} I \\ \Delta t_{min} \end{bmatrix} = 1,$$

Where, $M_{9\times 3}$ is a 9×9 inductive coupling matrix associated with the coils (the diagonal elements indicate self-inductance and the off-diagonal elements mutual inductance), and the other parameters are define above. As noted above, the present teachings are not limited to the use of 9 independent coils, but rather can be employed in MRI systems according to the present teachings having other numbers of independent coils.

III. Minimum Current Norm

Conventional gradient coils, which are generally water cooled, require strong cooling systems. In such a conventional gradient coil, notwithstanding the cooling system, the coil temperature can still vary depending on the duty cycle and the amplitude of current through the coil. Certain techniques have been introduced to reduce and optimize the gradient coil temperature to inhibit an increase in the coil's resistance so as to protect the gradient coil as well as to maintain the time dependency of the desired gradient waveform. Resistive power dissipated in the coil is one of the possible causes of the increased temperature.

One aspect of the present invention relates to the realization that it may be preferable in some cases to decrease the power loss in a coil at the expense of degradation of some other performance parameter. For example, a lower magnetic gradient strength may be employed to decrease power dissipation, though this may not be preferable in some cases due to decreased imaging performance. Accordingly, in one aspect, the present teachings provide methods and systems for dynamic optimization of power dissipation for unit gradient strength so as to protect one or more of the coils from overheating.

For illustrative purposes and also based on practical resistance parameters, in the following discussion, an array of identical coils are assumed. As such, the minimization of heat dissipation simplifies to minimization of the current norm. In other words, the square of the current norm becomes directly proportional to power dissipation. A decrease in power dissipation due to a decrease current (and hence current norm) can result in less mechanical stress on the coils and less acoustic noise depending on the geometry due to less induced force, though the relation between them is not direct. The minimization of mechanical stress, acoustic noise and induced forces can also be formulated in a similar manner. In some embodiments, the square of the current norm is minimized for a unit gradient strength while also limiting the peak gradient linearity error, e.g., by $\alpha_0$. Convex quadratic programming relations for minimizing the current norm are provided in Eq. (11). While in this formation, the DC resistance is ignored, in other formulations, a resistance matrix R, may be included in the optimization relations for minimizing the current norm and hence the power dissipation in an arbitrary set of coils.

$$\min_I \|I\|_2^2$$

$$\begin{bmatrix} (1-\alpha_0)1 G_{cent}^T - G^T \\ G^T - (1+\alpha_0)1 G_{cent}^T \end{bmatrix} I \leq 0$$

$$G_{cent}^T I = 1,$$

Eq. (11)

where,
I is a column vector containing current values for application to the coils,
M is a matrix containing elements corresponding to self and mutual inductive couplings of said plurality of coils,
G is a matrix of normalized gradient strength values for a selected number of observation locations in each of said coils for unit coil currents, and $G_{cent}^T$ is a column vector containing normalized magnetic gradient strengths at the centers of said coils for unit coil currents, and
$\alpha_0$ represents a constraint imposed on the gradient field strength though said volume of interest.

IV. Minimum Peak B-Field

As indicated above, higher slew rates are desirable in MRI. In recent MRI scanners, the slew rate is mostly limited by a physiological effect called peripheral nerve stimulation (PNS). Currents induced in the body by a rapid change in the magnetic field (i.e., a strong magnetic field gradient) can cause peripheral nerve stimulation.

More specifically, an electric field (E-field) induced by switching gradient fields can result in induced voltage on the nerves. Although a comprehensive PNS threshold analysis should calculate E-field distribution inside the patient as well as neurodynamic properties, models are available that can predict PNS threshold. In some embodiments, such models can relate the time rate of change in the vector magnetic field, i.e., $$\frac{\partial B}{\partial T},$$

to the PNS threshold. By way of example, in some embodiments, a method for determining the PNS threshold described in a paper titled "Prediction of peripheral nerve stimulation thresholds of MRI gradient coils using coupled electromagnetic and neurodynamic simulations," published in Magnetic Resonance in Medicne 2019, 91:686-701, which is herein incorporated by reference in its entirety, can be employed. This reference discloses computing the electric field induced by the switching fields within a detailed electromagnetic body model, which includes a detailed atlas of peripheral nerves. Potential changes along the nerves are then calculated and their response is evaluated using a neurodynamic model.

Similarly, gradient fields generated in larger volumes of interest (VOI) can cause a decrease in the PNS thresholds due to the increased E-field inside the geometry. Thus, it is expected that minimizing the maximum amplitude of the vector B-field would result in improved PNS thresholds. In some embodiments, methods similar to those disclosed herein for minimizing the maximum amplitude of the vector B-field can be employed to minimize the E-fields, which can be in some cases more effective in inhibiting PNS. In such embodiments, E-field generated by each gradient coil is calculated separately and can depend on the electromagnetic properties of the subject.

In some embodiments, the minimization of the maximum amplitude of the vector B-field can lead to an increase in the PNS thresholds and hence increase the attainable slew rates.

The maximum amplitude of the vector B-field ($B_{max}$) inside a volume of interest (VOI), e.g., a cylindrical volume with a diameter of 20 cm and a length of 27.5 cm, can be defined in accordance with the following relation:

$$B_{max} = \max_r |\Sigma_{i=1}^N B_i(r) I_i|$$

Eq. (12)

wherein,
$B_i(r)$ represents three-dimensional magnetic field vector associated with the $i^{th}$ coil at a plurality of locations (r) in said volume of interest,
$I_i$ is the current associated with the $i^{th}$ coil.

In many embodiments, $B_{max}$ calculations are performed in a bigger volume that a volume of interest (VOI), e.g., a bigger cylindrical volume, since maximum magnetic field outside the imaging region may still be effective in stimulating PNS. The following convex optimization relation:

$$\min_I B_{max} \quad \text{Eq. (13)}$$

$$\begin{bmatrix} (1-\alpha_0)1G_{cent}^T - G^T \\ G^T - (1+\alpha_0)1G_{cent}^T \end{bmatrix} I \leq 0$$

$$G_{cent}^T I = 1,$$

wherein,
- I is a column vector containing current values for application to the coils,
- M is a matrix containing elements corresponding to self and mutual inductive couplings of said plurality of coils,
- G is a matrix of normalized gradient strength values for a selected number of observation locations in each of said coils for unit coil currents,
- $G_{cent}^T$ is a column vector containing normalized magnetic gradient strengths at the centers of said coils for unit coil currents, and
- $\alpha_0$ represents a constraint imposed on the gradient field strength though said volume of interest.

V. Minimum Peak E-Field

The maximum amplitude of the vector E-field ($E_{max}$) inside a volume of interest (VOI) can be defined in accordance with the following relation:

$$E_{max} = \max_r |\Sigma_{i=1}^N E_i(r) I_i| \quad \text{Eq. (14)}$$

where,
- $E_i(r)$ represents three-dimensional magnetic field vector associated with the $i^{th}$ coil at a plurality of locations (r) in said volume of interest,
- $I_i$ is the current associated with the $i^{th}$ coil.

In many embodiments, $E_{max}$ calculations are performed in a bigger volume that a volume of interest (VOI), e.g., a bigger cylindrical volume, since maximum electric field outside the imaging region may still be effective in stimulating PNS.

The following convex optimization relation can be employed for minimizing the peak vector electric field:

$$\min_I E_{max} \quad \text{Eq. (15)}$$

$$\begin{bmatrix} (1-\alpha_0)1G_{cent}^T - G^T \\ G^T - (1+\alpha_0)1G_{cent}^T \end{bmatrix} I \leq 0$$

$$G_{cent}^T I = 1,$$

where,
- I is a column vector containing current values for application to the coils,
- M is a matrix containing elements corresponding to self and mutual inductive couplings of said plurality of coils,
- G is a matrix of normalized gradient strength values for a selected number of observation locations in each of said coils for unit coil currents,
- $G_{cent}^T$ is a column vector containing normalized magnetic gradient strengths at the centers of said coils for unit coil currents, and
- $\alpha_0$ represents a constraint imposed on the gradient field strength though said volume of interest.

In some embodiments, more than one of the above parameters can be concurrently optimized. In some embodiments, one or more of the parameters can be constrained while one or more other parameters are optimized. For example, in some embodiments, the magnetic field gradient can be maximized while concurrently minimizing the peak magnetic field vector and constraining the peak linearity error below a selected threshold.

Figure 3:
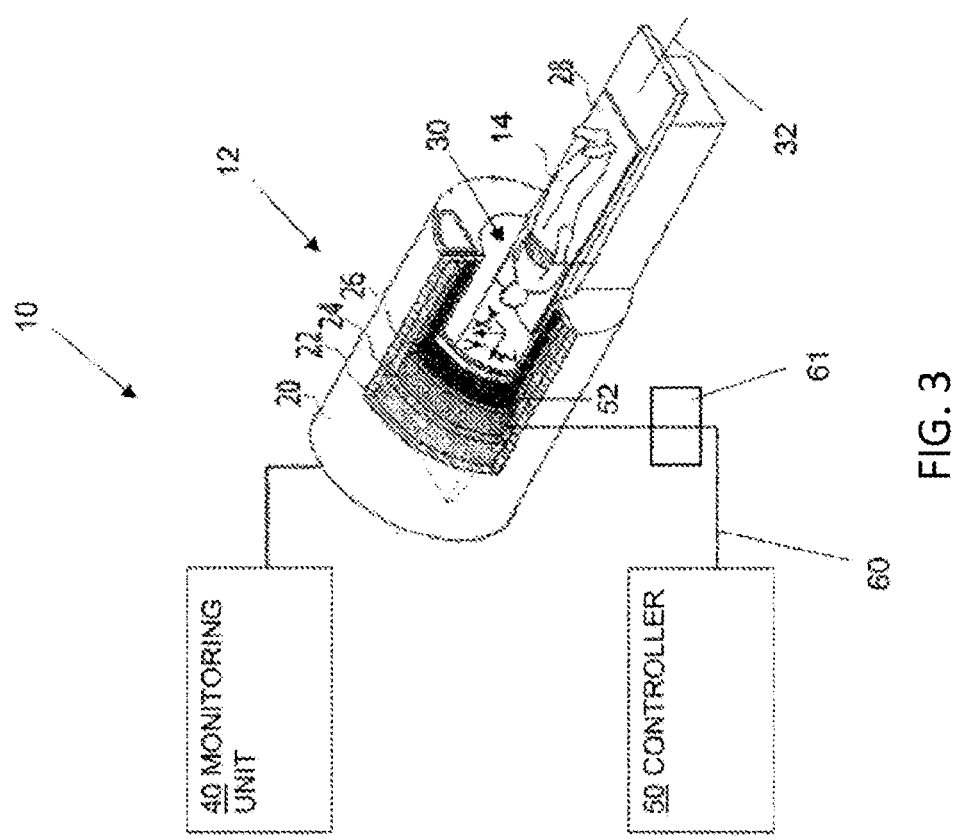

FIG. 3 schematically depicts an embodiment of a magnetic resonance imaging system (10) in which the present teachings can be incorporated. In one arrangement, the magnetic resonance imaging system (10) includes a magnetic field generator (12), a monitoring unit (40) configured to monitor and/or control positioning of an object (14) disposed within a gantry (20), and a controller (50).

The magnetic field generator (12) is configured to generate an MRI image of an object (14), such as a patient. In the example illustrated, the magnetic field generator (12) includes the gantry (20) surrounding a main magnet (22), a gradient coil array (24), and an RF coil (26). The gantry (20) can minimize or prevent radiation of electromagnetic waves generated by the main magnet (22), gradient coil array (24), and the RF coil (26) from interfering with local electrical equipment, such as the monitoring unit (40) or controller (50).

The gantry (20) can further define a bore (30) extending along a longitudinal axis (32). In use, the object (14) can be placed on a table (28) that can be inserted into the bore (30) along the longitudinal axis (32). Further, the bore (30) is configured to receive electromagnetic fields generated by the main magnet (22), gradient coil array (24), and the RF coil (26). For example, as indicated in FIG. 1, the main magnet (22), the gradient coil array (24), and the RF coil (26) can extend along a longitudinal axis (32) of the bore (30) and the gantry (20). The main magnet (22) and gradient coil array (24) can generate an electromagnetic field and an oblique magnetic field, respectively, within the bore (30) while the RF coil (26) can provide an RF excitation signal within the bore (30) toward the object (14).

In some embodiments, the RF pulse can be configured as a single-band RF pulse having a bandwidth, e.g., in a range of between 10 Hz and about 100 kHz. In another example, the RE pulse can be configured as a multi-band RF pulse having a bandwidth, e.g., in a range of about 100 Hz and about 3-5 MHz. Further, the RF coil can generate the RF pulse over a variety of pulse durations. For example, the RF coil can be configured to generate an RF pulse having a duration between about 10 microseconds and about 30 milliseconds.

The main magnet (22) is configured to generate a primary or $B_0$ magnetic field, which is a static magnetic field, to align the magnetic dipole moments of the nuclei included in the object (14) in a predetermined direction. The $B_0$ magnetic field determines a resonance frequency of the nuclei of the object (14) being imaged, depending on the gyromagnetic ratios of the nuclei. As the $B_0$ magnetic field generated by the main magnet (22) is relatively strong and uniform, a relatively precise and accurate MR image with respect to the object (14) can be generated by the MRI system (10). in some embodiments, the primary or $B_0$ magnetic field generated by the main magnet (22) can have any suitable strength, e.g., 1.5 T, 3 T, 7T, or 10.5 T.

The gradient coil array (24) is configured as a plurality of independent coils (52) distributed about the bore (30), and can be configured as x-gradient coils, y-gradient coils, and/or z-gradient coils for each axis of the MRI system (10).

Figure 4:
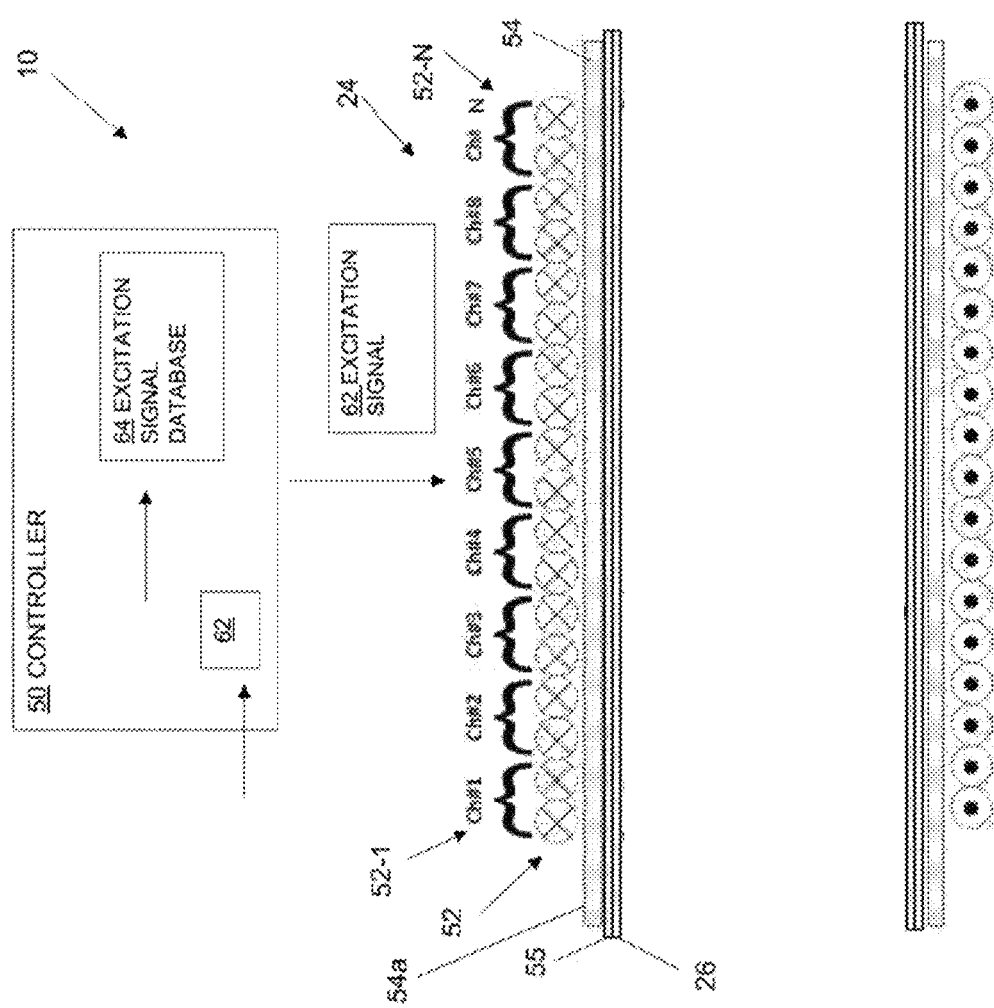
FIG. 4 illustrates a schematic representation of a controller and gradient coil array of FIG. 3.

For example, with additional reference to FIG. 4, the gradient coil array (24) is configured as a z-gradient coil array having independent coils (52) disposed about an enclosure (54a) provided by a shell (54). The term "independent coils (52)," as used herein, is intended to mean that a current can be applied to each coil independent of the other coils. For example, in some embodiments, different currents can be applied to different coils of the gradient array. While each of the independent coils (52) can be formed in a number of ways, in one arrangement, each independent coil (52) is formed by winding a wire about the enclosure 54a. Further, the gradient coil array (24) can include any number of independent coils (52) distributed along a longitudinal axis (32) of the enclosure (54a). For example, as illustrated the gradient coil array (24) includes N number of gradient coils (from first gradient coil (52-1) to $N^{th}$ gradient coil (52-N)), where N can be for example, in a range of about 2 to 24 for a single layer and in a range of about 2 to 96 for either three or six different layers.

Returning to FIG. 4, the RF coil (26) is configured to excite spins of the atoms of the object (14) being imaged. While the RF coil (26) can be configured in a variety of ways, in one arrangement, the RE coil (26) is configured as a birdcage RF coil (26). Further, in the arrangement illustrated, a shield (55) is disposed within the enclosure (54a) to decouple an RE field generated by the RF coil (26) from a magnetic field generated by the gradient coil array (24).

Returning to FIG. 1, the controller (50), such as a computerized device having a memory and a processor, is disposed in electrical communication with the gradient coil array (24) of the magnetic field generator (12) via a set of cables (60). in one arrangement, each cable of the set of cables (60) electrically connects the controller (50) to a respective independent coil (52) of the gradient coil array (24). To minimize the introduction of noise into the set of cables (60), a filter apparatus (61) can be disposed in electrical communication with each cable of the set of cables (60). For example, the filter apparatus (61) can include a capacitor, such as a 10 nF capacitor or other filters, such as multi-stage filters or special ripple cancellation filters or any other filter that suppresses the ripple frequency while having a minimal influence on the gradient operating frequencies (0-20 kHz), disposed between each cable and a shield, such as a Faraday cage (not shown), at least partially surrounding the gradient coil array (24).

In this embodiment, the controller (50) is configured to calculate a current vector according to the present teachings for application to the coils via a plurality of amplifiers, as discussed in more detail below. The controller can include instructions embedded in software and/or firmware for solving the above relations for obtaining a current vector that can optimize one or more of the above parameters, such as, gradient field strength, gradient linearity error, etc.

Figure 5:
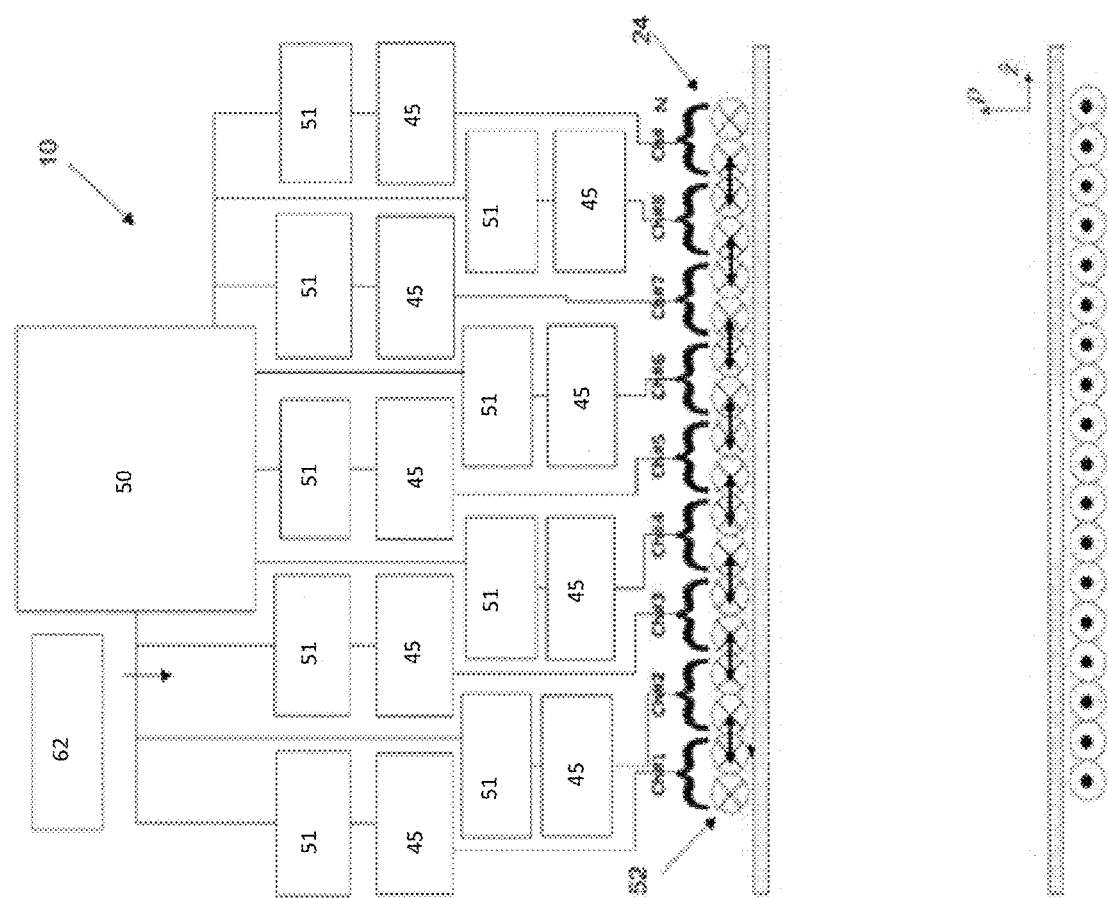
FIG. 5 illustrates a schematic representation of the controller and gradient coil array of FIG. 4 having an independent amplifier and excitation source for each gradient coil of the gradient coil array, according to one arrangement, FIG. 6 schematically depicts an example of the implementation of a controller according to an embodiment, FIG. 7 schematically depicts magnetic gradients for diffusion encoding.

As shown in FIG. 5, in this embodiment, the MRI system (10) includes one or more excitation sources (51) disposed in electrical communication with the controller (50) and with the independent coils (52) of the gradient coil array (24). Further, in this embodiment, the MRI system (10) can include one or more amplifiers (45) disposed in electrical communication with respective excitation sources (51) and with respective independent coils (52) of the gradient coil array (24). While each amplifier (45) can be configured in a variety of different ways, in one arrangement, each amplifier (45) is configured as H-bridge amplifier. An example of such H-bridge amplifier is disclosed in U.S. published Application 2018/0011156, which is incorporated herein by reference in its entirety.

In use, the controller (50) is configured to transmit the excitation signal (62) to the excitation sources (51). The amplifiers can amplify the excitation signals (62) generated by the excitation sources (51) and apply those excitation signals (62) to the independent coils (52) to induce currents therein corresponding to an optimal current vector obtained utilizing the present teachings. While the excitation sources (51) can be configured in a variety of different ways, in one arrangement, the excitation sources (51) are configured as voltage sources, current sources, or as a combination of voltage and current sources. Returning to FIG. 4, excitation signal database (64) can be set of gradient pulse signals that can be used in imaging are stored in database, these pulses can also be arbitrarily programmed.

The controller (50) can be implemented in hardware, firmware and/or software in a manner known in the art. For example, the controller (50) can include a processor, memory modules (e.g., random access memory (RAM) and permanent memory) and one or more communication buses which allow communication among different components of the controller, among other elements.

Figure 6:
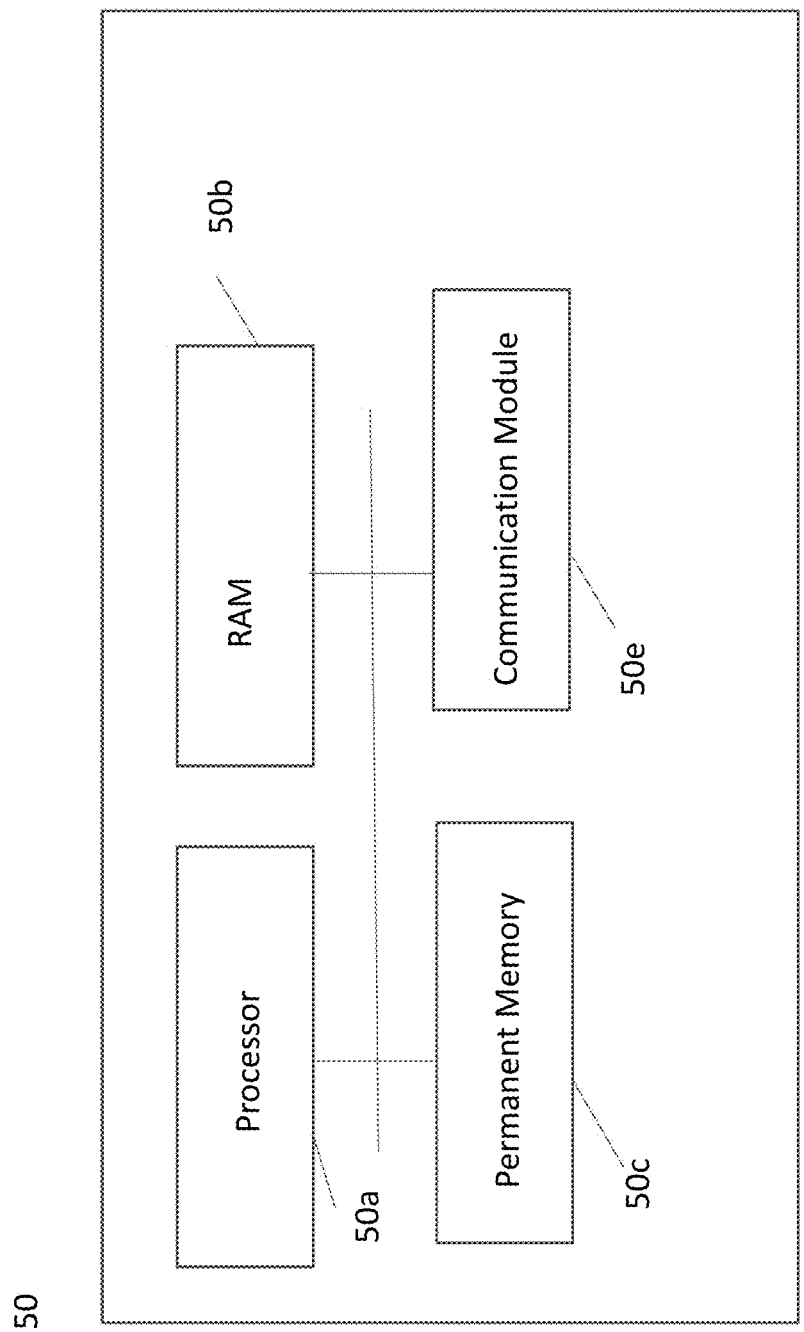

By way of illustration, FIG. 6 schematically depicts an example of an implementation of the controller (50), which includes, among other conventional components, a processor (50a), a random access memory (RAM) (50b), a permanent memory (50c), and a communication bus that allows communication between the processor and the various components of the controller, such as the RAM (50b) and/or the permanent memory (50c). The controller (50) further includes a communication module (50e) that allows the controller to communicate with the excitation sources (51) (See, FIG. 5). In some embodiments, the instructions for calculating a current vector that would optimize one or more of the parameters described herein can be stored in the permanent memory (50c). During runtime, the processor can transfer the instructions to the RAM (50b) and execute those instructions so as to determine an optimal current vector containing current values for application to the coils.

The teachings of the present teachings can be employed in a variety of modalities. For example, in some embodiments, the present teachings can be employed for imaging tissue diffusivity.

In MRI system (10), diffusivity of the tissues can be imaged. The application of a diffusion encoding gradient (total integral is zero) before signal acquisition results in a decay of the signals emanating from moving spins while the stationary spins are not affected. In other words, due to diffusion of the particles, signals will decay. Based on a first order model for diffusion, the signal will decay as $e^{-bD(x,y)}$, where b is the diffusion encoding as below and D is the diffusivity of the tissue. Usually multiple (at least two) acquisitions are performed with different b-values and diffusivity map, D(x,y), called Apparent Diffusion Coefficient (ADC) can be calculated from the ratio of the images as follows (where I1 and I2 represent, respectively, two decaying signals)

$$I_1(x,y)=e^{-b1D(x,y)} \qquad \text{Eq. (16)}$$

$$I_2(x,y)=e^{-b2D(x,y)} \qquad \text{Eq. (17)}$$

$$D(x,y)=\ln(I_1/I_2)/(b_2-b_1) \qquad \text{Eq. (18) (generally more acquisitions are obtained and data is fitted to the model)}$$

Figure 7:
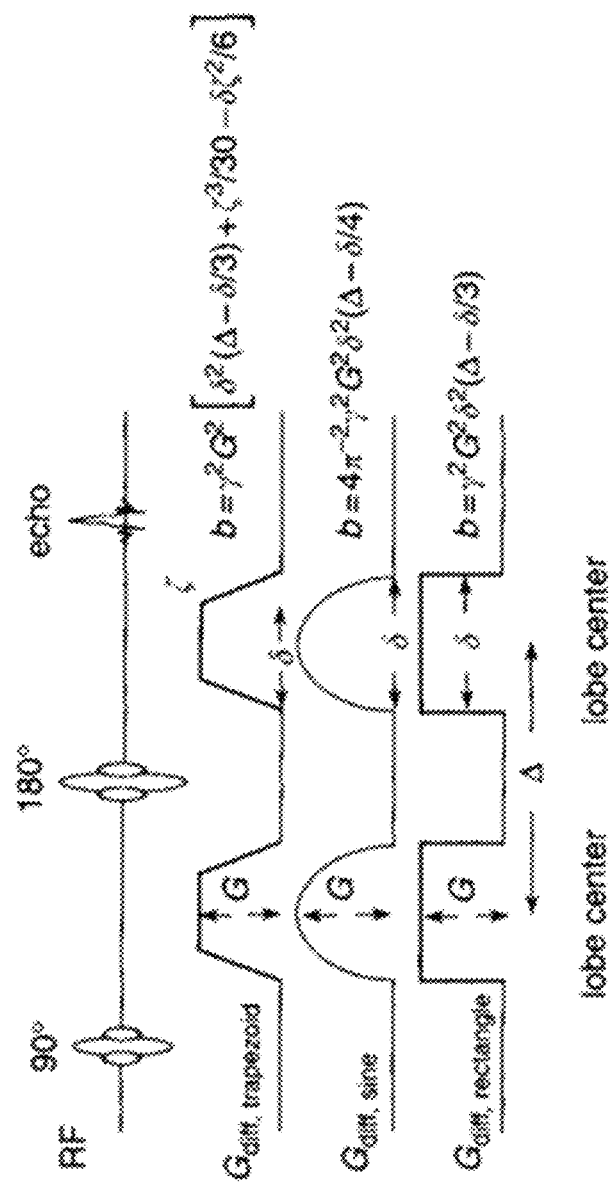

As shown in FIG. 7, b-value is usually proportional with the square of the gradient strength. It also depends on the duration of the diffusion encoding in a more complicated manner (close to cubic). Sometimes high b-values are desirables to obtain contrast between different tissue types, which requires an increase in the duration of diffusion encoding. Diffusion encoding gradients have generally long durations which increases the signals echo time (TE, the signal data acquisition time). Because of the increased echo time, signal decays as $e^{-TE/T2}$ where T2 is a tissue-dependent parameter. Therefore, the signals can generally exhibit low SNR and the images can be noisy.

In some embodiments of the present teachings, the diffusion gradient can be optimized only in the VOI, thus allowing more linearity error as greater gradients are obtained. This can in turn reduce the diffusion encoding duration and reduce TE and increase the resulting SNR. However, the linearity error should be taken into account in calculating D(x,y) in that b-value is not a constant value anymore. Rather, it becomes a distribution b(x,y). Therefore, $e^{-b(x,y)D(x,y)}$ is the signal decay and b-values in the above formulations also becomes b(x,y).

For each pixel, depending on the gradient value, b-value can be calculated based on well-known relations. In conventional ADC map calculation, spatial dependency of the b-value is not taken into account. Some high-quality diffusion postprocessing techniques correct the natural nonlinearity of the gradient fields. In contrast, in some embodiments of the present teachings, gradient nonlinearities are intentionally created and the b-value is corrected in postprocessing. Since b-value is proportional with $G^2$, linearity errors can be amplified significantly if not accounted for.

Diffusion Tensor Imaging (DTI) is another MRI modality. This imaging modality is an extension of diffusion encoding gradients in 3 dimensions and D is modeled as a tensor (requiring 6 measurements in 6 directions). Therefore, DTI measures the diffusion in 3 directions solves a tensor D. The present teachings can also be applied to DTI as well.

The following simulations results are provided for further illustration various aspects of the present teachings, and are not intended to limit the scope of the present invention.

EXAMPLE

In one simulation of the above optimization methods, the above linear programming relations were solved using MATLAB-2017a (and more specifically using "linprog" function of MATLAB). "Dual-simplex" algorithm was used to solve the linear programming relations. Conventional linear programming problem was defined as in Eqs. (20) below, where x is the free optimization variable, f is an arbitrary vector that its dot product with x is minimized, A and b are the matrix and vector for the inequality constraint, $A_{eq}$ and $b_{eq}$ are the matrix and vector for equality constraint. Last constraint defines the lower and upper bounds on the free parameter. All linear programming problems were formulated to be compatible with this syntax.

$$\min_x f^T x$$

$$A \cdot x \leq b$$

$$A_{eq} \cdot x = b_{eq}$$

$$lb \leq x \leq ub \quad \text{Eq. (19)}$$

Since optimization problems for minimizing the current norm and the peak B-field are not linear but convex, they are solved using a local solver called "fmincon" using the "interior point methods, which is another built-in function in MATLAB.

The achievable minimum linearity error of the magnetic field gradient was solved for both cylindrical and ellipsoid VOIs. $L_{VOI}$ and $D_{VOI}$ were swept between 2 to 20 cm with 2-cm step sizes to understand the effect of VOI on the peak linearity error. For the other optimization problem types enumerated above, spherical VOI with $D_{VOI}$ of 20 cm was chosen, limit on the peak linearity error was swept between 1% and 51% and $L_{VOI}$ was swept from 2 to 20 cm as in the previous cases.

Figures 8A, 8B, 8C:
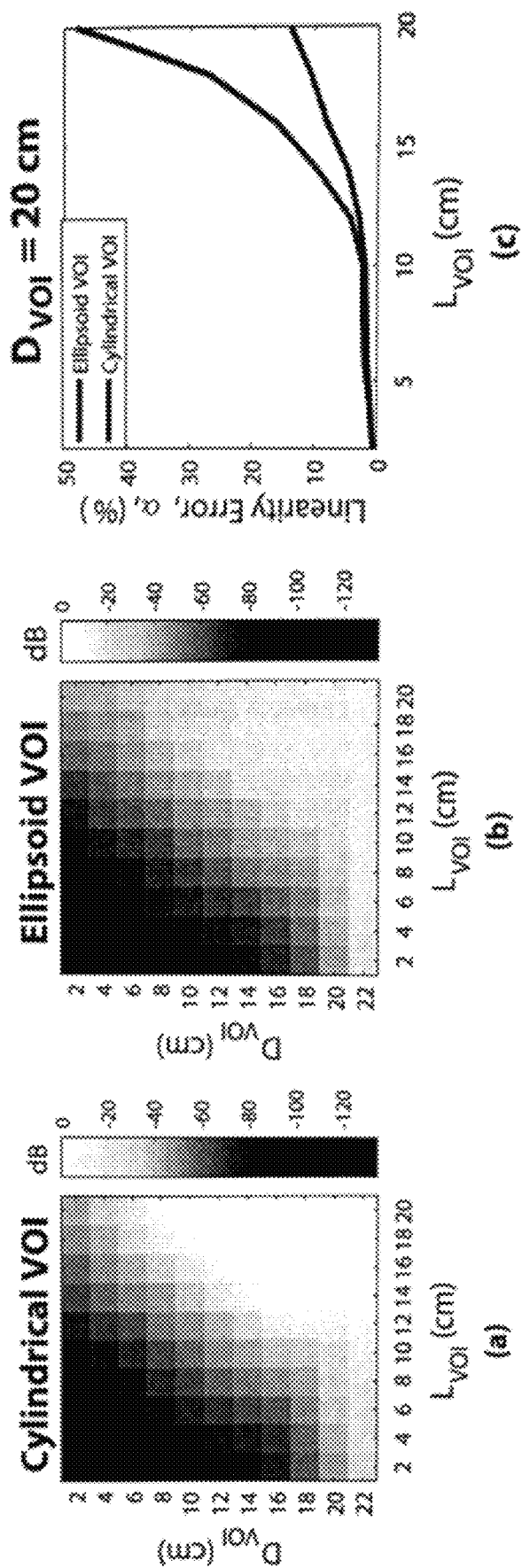
FIGS. 8A and 8B show optimization results for minimizing the linearity error ($\alpha$) for a cylindrical and a truncated ellipsoid volume of interest, respectively, where the values of $\alpha$ are provided in db calculated as $20 \log_{10} \alpha$ to represent the minimum value of $\alpha$ of $0.02 \times 10^{-5}$ (−134 dB) and maximum value of $\alpha$ of 0.52 (−5.6 dB).
FIG. 8C shows a comparison of minimum possible value of α for the cylindrical and truncated ellipsoid VOIs with diameter of 20 cm.
Figures 10A, 10B, 10C, 10D:
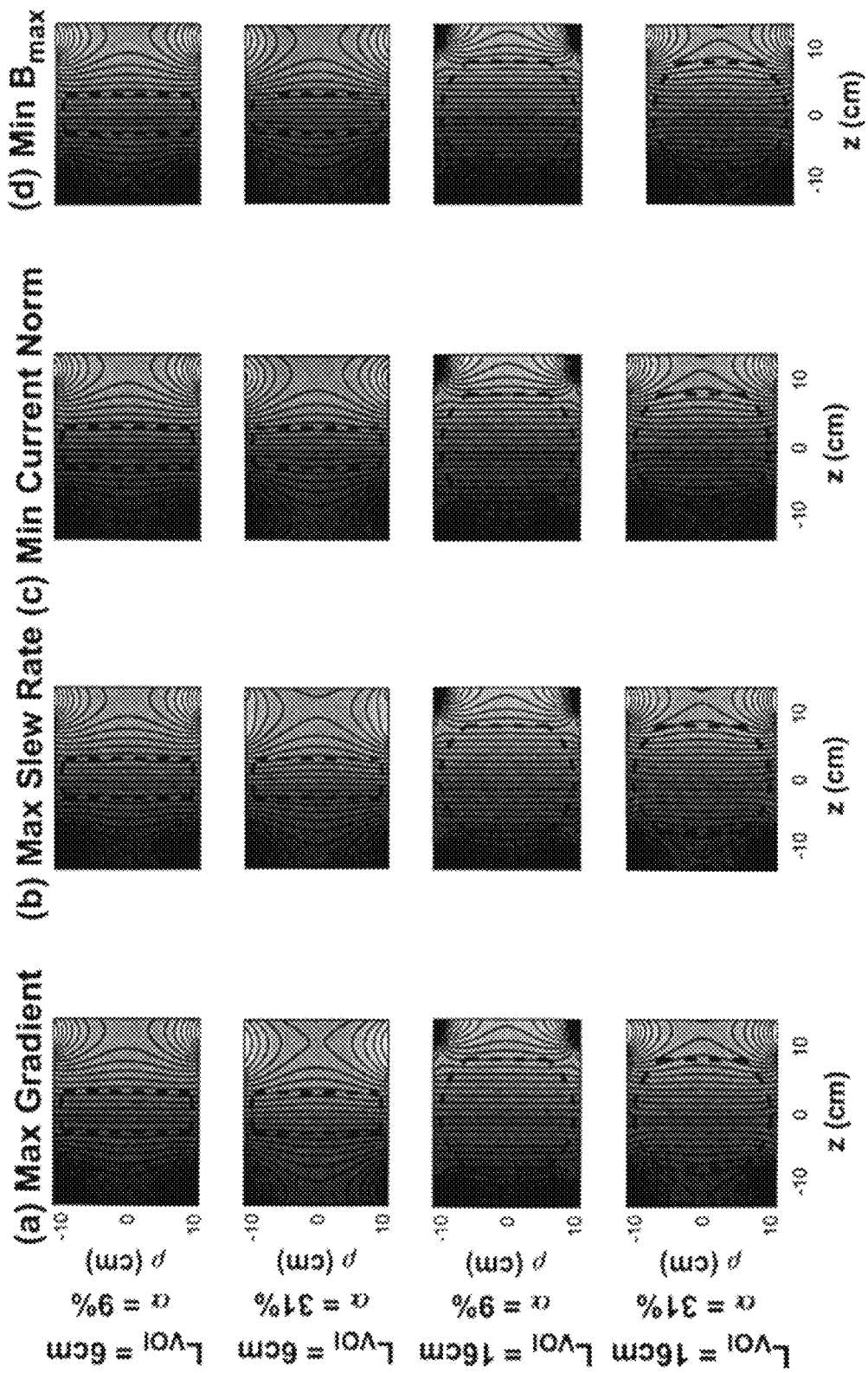
FIGS. 10A, 10B, 10C, and 10D show example magnetic field profiles associated with optimizing gradient field (A), slew rate (B), the current norm (C) and vector B-field (D) with different $L_{VOI}$ and α parameters.

FIGS. 8A, 8B, and 8C show the minimum possible α for both cylindrical and ellipsoid VOIs with variable diameters and lengths. Expectedly, dimension reduction in all directions can provide lower peak α. In the extreme cases, linearity error of the smallest simulated volume is more than millions of times of the linearity error of the largest simulated volume. Moreover, ellipsoid VOIs provides better gradient linearity than cylindrical VOIs with similar parameters. The volume difference between the cylindrical and ellipsoid VOIs are the edges of the cylinder, which are the most challenging parts to maintain gradient linearity.

FIGS. 9A, 9B, 9C, and 9D show optimization results that confirm that higher linearity error and/or smaller VOI can result in higher performance parameters with respect to maximum gradient, maximum slew rate, minimum current nor and minimum peak vector B-field. In most cases, 2 cm decrease in $L_{VOI}$ or 2% increase in a can result in dramatic performance changes. On the contrary, performance parameters are less sensitive to changes in $L_{VOI}$ and α, especially for the edges of the simulation domain. Therefore, these results can be used as lookup table to better utilize the tradeoffs between performance parameters for a specific application. It should be understood that while in many these examples, the center of VOI at z=0, in other embodiments the VOIs can be shifted such that they are centered at other locations.

FIGS. 10A, 10B, 10C, and 10D show example magnetic field profiles generated by optimized currents for constraint pairs of ($L_{VOI}$=16 cm, 9 cm) and (α=9% and 31%). The field distributions in these figures suggest that dependency of the performance parameters are as function of $L_{VOI}$ and α are similar. The reason for this might be due to the fact that specifying maximum tolerable α and minimum required $L_{VOI}$ may be sufficient to obtain near optimal solutions for all other performance parameters.

The above results show that the present teachings can be utilized to optimize dynamically the current a z-gradient array for different performance parameters for a given allowed peak linearity error and size of the VOI. Although in this simulation, each performance parameter was optimized separately, it is possible to utilize the present teachings to optimize weighted average of these parameters.

In general, all performance parameters can be used in either constraints or in the cost function. For each specific pulse sequence, demand on the parameters may change.

Without being limited to any particular theory, in many embodiments, the optimization of magnetic field gradient in the VOI does not affect the atomic spins in the subject to be imaged or imaging techniques. Thus, such optimization is expected not to present any disadvantage for the imaging. When the VOI is too small, some non-bijective regions of the gradient field distribution might overlap with the excited parts of the objects and cause aliasing for the imaging. Transmit or receive array RF coils can be used to suppress the signal coming from these overlapping parts. Another option is to force bijectivity of the fields inside some specified regions as part of the optimization problem. In some embodiments, the gradient linearity error can be corrected in post-processing in many applications if the spatial dependency of the error is well known. Some disadvantages such a nonuniform SNR (signal-to-noise ratio) for each voxel may be observed despite post-processing correction.

APPENDIX A

I. Circuit Model

As discussed above, in many embodiments of the present teachings, a plurality of independent gradient coils are employed to generate gradient fields and encode the spatial coordinates of spins onto the resonance frequency. Such coils can exhibit mutual inductive couplings. In some embodiments, a feedforward system described herein can be employed to enable analytical calculations of the required voltages for application to the coils for driving the mutually coupled coils so as to obtain the flow of a desired current through each coil.

Figure 11:
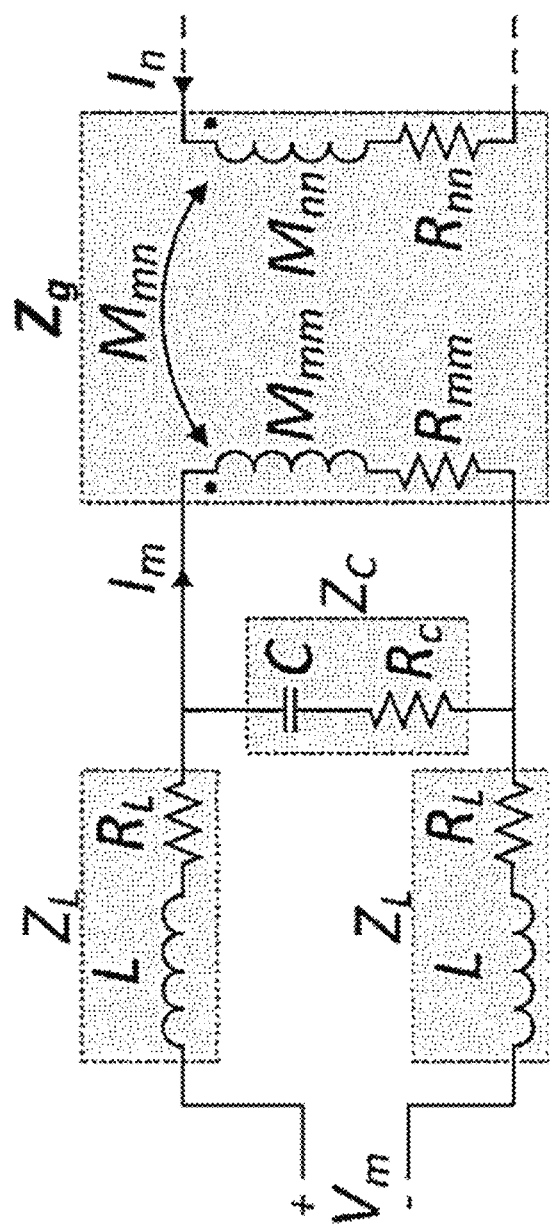
FIG. 11 is a schematic circuit model for single-state LC gradient filters and mutually coupled gradient coils.

FIG. 11 shows the linear and time invariant circuit model of a plurality of gradient coils and a single stage of an LC gradient filter, where $Z_L$ and $Z_C$ represent the impedances of the series inductor and parallel capacitor of the filter, respectively. In many situations, each cable of the coil is carried inside the MR room using a feedthrough capacitor to filter out the RF noise penetrating into the shielded room. Although capacitance of the feedthrough filters can be added to ZC in differential mode, their impedance is dominated by ZC in the operating bandwidth of gradient power amplifiers (GPAs). As such, the capacitance of the feedthrough filter is excluded in the following model.

The impedance of the mutually coupled gradient coils is modeled by a series combination of a diagonal resistance matrix, R, and a mutual coupling matrix, M, in which the diagonal terms determine the self-inductance and the off-diagonal terms determine the inductive coupling between the channels. The input and out characteristics of this model at a single frequency can be obtained as a MIMO (multiple-input-multiple-output) system to account for cross couplings as in the following relation:

$$V(\omega) = \left(Z_g + 2Z_L E + \frac{2Z_L}{Z_C}Z_g\right)I(\omega) \qquad \text{Eq. (20)}$$

where,

V and I for the input voltage and the output current of the channels,

E is the identity matrix, $Z_g$ is the coil impedance matrix, which can be written as $Z_g = R + j\omega M$.

The output filter is designed to suppress the current ripple a the effective switching frequency of the amplifiers while having minimal influence a the bandpass frequencies. The capacitive term in the above relation can be neglected in the low-pass regime, which leads to the definition of the first-order time domain relation between the input voltage and output current, as in Equations 2a an 2b, which can be used in pulse width modulations (PWM) calculations.

$$V(t) = M^{total}\frac{dI(t)}{dt} + R^{total}I(t) \qquad \text{Eq. (21)}$$

$$M^{total} = M + 2LE$$

$$R^{total} = R + 2R_L E$$

II. Minimum Rise Time

In a mutually coupled array configuration, the maximum amplifier voltage and impedance of a single channel are not sufficient to determine the rise time for a given current value. Current flowing through each coil is highly affected by the currents flowing through the other coils, especially neighboring coils with strong coupling. Therefore, the rise times and resulting slew rates should be calculated for each current amplitude and timing. For a particular time dependence of a fixed magnetic profile, all coils should be driven by current with different amplitudes but exactly the same time dependence. In the case of a typical trapezoidal current with equal rise and fall times, the peak voltage is required either at the end of the rise period or the beginning of the fall period. If the voltage limitations of the amplifiers are identical for each channel, there is a lower bound on the rise time determined by the coil with the highest peak voltage, which should be driven by the maximum voltage limitation of the amplifiers.

Considering Equation 21, the minimum possible rise time for a trapezoidal time dependence of any magnetic field profile can be calculated as follows:

$$\Delta t_{min} = \max_{1 \le m \le N} \left\{ \frac{\left|\sum_{n=1}^{N} M_{mn}^{total} \cdot I_n\right|}{V_{max} - |R_{mn}^{total} \cdot I_m|} \right\} \qquad \text{Eq. (22)}$$

where, $\Delta t_{min}$ is the minimum rise time, $I_n$ is the current amplitude of the nth channel during the plateau period of the trapezoidal waveform, $M_{mn}^{total}$ and $R_{mm}^{total}$ are the entries of $M^{total}$ and $R^{total}$, respectively, at $m^{th}$ row and $n^{th}$ column. $V_{max}$ is the maximum voltage limitation of the identical amplifiers.

III. Optimization of Gradient Currents

A gradient array system enables dynamic optimization of the field profile with dynamically adaptable current weightings. A least squares optimization problem can be formulated to solve for the optimal current weightings for a given target magnetic field profile as follows:

$$\min_{I_w, \alpha} \|B_{target} - \alpha BI_w\|_2 \qquad \text{Eq. (23)}$$

where, $B_{target}$ is a column vector consisting of a target magnetic field at discrete locations, B is a matrix with column vectors consisting of measured or simulated magnetic field profiles for a unit current applied to each coil, $I_w$ is a column vector representing the current weightings of all coils (channels) with unit infinity norm, and $\alpha$ is a normalization factor to ensure that current weightings are normalized such that maximum current among the channel is unity.

Although one can define many other optimization problems, this optimization problem is preferred for the current weightings in this example because it provides the minimum error norm as the simple analytical solution, as shown in Eq. (24) below:

$$I_w^* = \frac{B^+ B_{target}}{\|B^+ B_{target}\|_\infty} \qquad \text{Eq. (24)}$$

where, $B^+$ is the pseudoinverse of B.

IV. Gradient Array System

Figure 12:
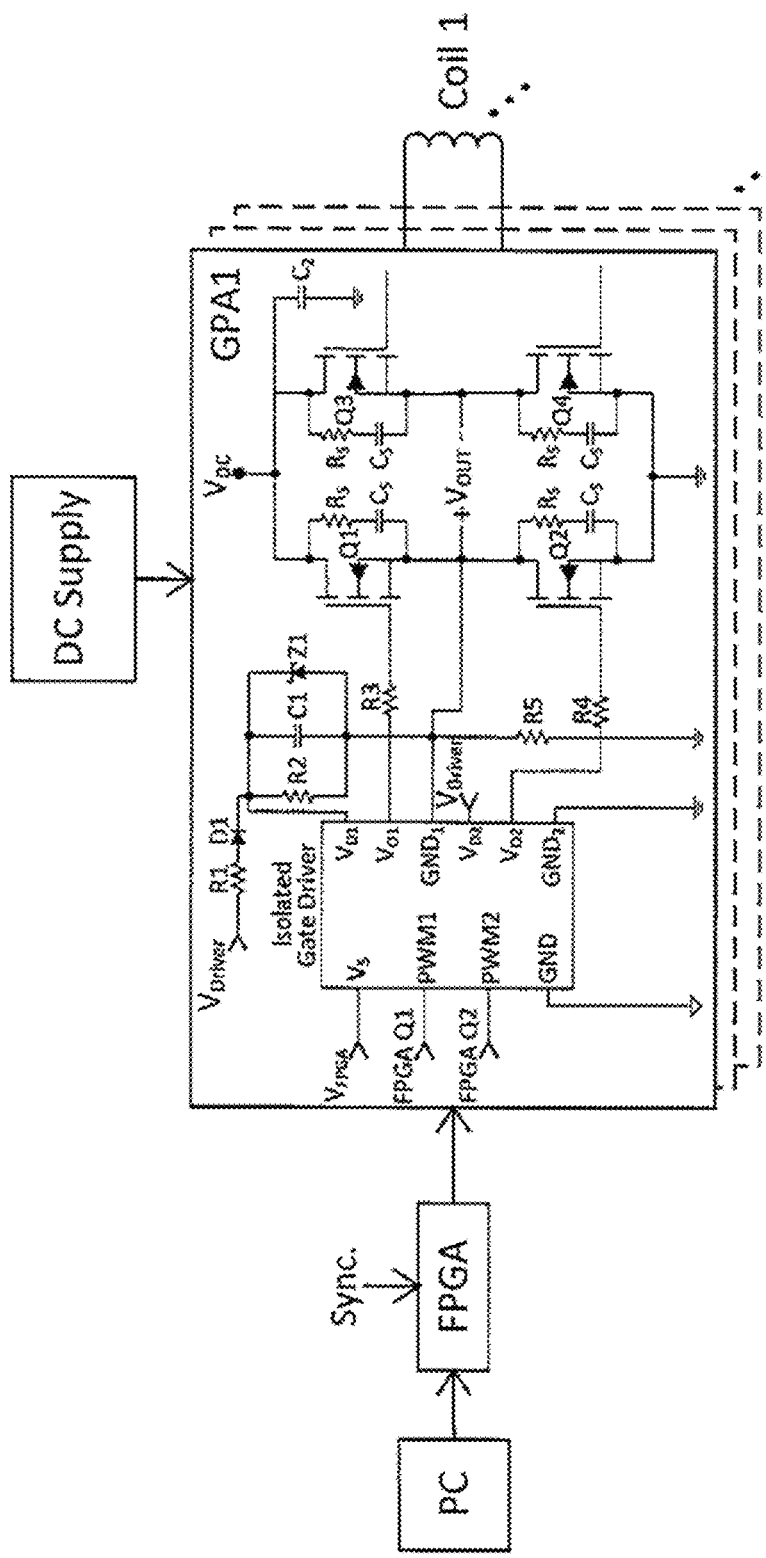
FIG. 12 is a schematic illustration of a full H-bridge gradient amplifier array.

FIG. 12 depicts the main components of an example of a gradient amplifier array setup. Each GPA is in 1-stage H-bridge configuration, and bootstrap circuit is used to drive the high side switches. An isolated gate driver (ADuM7234, Analog Devices, Norwook, Mass.) is used to switch NMOS transistors (IRFP250n, Infineon Technologies Americas Corp., El Segundo, Calif.), providing 50 V and 20 A at the output. A single power supply is used to fee all the GPAs, because each GPA consists of a single-stage H-bridge rather than a conventional stack configuration.

The evaluation board of Xilinx Virtex5 FPGA (XMF5, PLDkit OU) with a 100 MHz clock frequency is used to generate the PWM control signals. The PWM period is chosen as 20 microseconds, which leads to a 10 microsecond dwell time and 100 kHz effective PWM frequency for the center-aligned PWM configuration. Considering the clock frequency, the duty cycle can be set approximately with 10 bits of resolution for all channels independently. The FPGA can be programmed by a user interface ins PC by means of serial communication. The user interface allows programming of the channel impedance, desired current waveforms, PWM delays to prevent shoot through in the H-bridge circuitry, supply voltage, and PWM periods independently for an arbitrary number of channels. A 9-channel Z-gradient array was used to demonstrate the present methods for driving mutually coupled gradient coils. Each gradient channel consisted of 36 turns wound on a plastic cylindrical shell with a diameter of 25 cm and a total length of 27.5 cm for 9 channels. Tx/Rx birdcage coil and its shield were also placed inside the gradient coil array. A schematic illustration of the Z-gradient array is provided in FIG. 4.

V. Impedance Measurements

The lumped element circuit model assumes that the inductance, capacitance and resistance values are constant in the operating bandwidth of the amplifiers. However, gradient waveforms require high fidelity to the programmer's design. Therefore, the impedance of the filter components and gradient coils were measured as a function of frequency using a GW Instek LCR-B105G high-precision LCR meter (Good Will Instruments, Taiwan) for comparison with the low-frequency approximations of the lumped circuit model. Extended open and short circuit tests were performed to measure the self and leakage inductance of the mutually coupled coils including the winding resistances. First, the impedance of the filter components and the self-impedance of each gradient channel were measured up to the operating bandwidth of the amplifiers ($\leq$10 kHz) with a 100 Hz step size. Calculation of the frequency-dependent cross-channel impedance, $Z_{mn}$, requires another impedance measurement of the $m^{th}$ channel when the nth channel is a short circuit. After calculating the $Z_g$, the impedance of the filter components were also measured to calculate the frequency response of the circuit, $V_m(\omega)/I_n(\omega)$, based on the impedance measurements according to above Equation (1).

The above method was used to optimize three example current vectors for different magnetic field distributions, namely, a linear Z-gradient ($B_z \propto z$), second-order Z2 ($B_z \propto z^2 - 0.5(x^2+y^2)$) and third-order Z3 ($B_z \propto 2z^3 - 3z(x^2+y^2)$) fields inside a 15-cm diameter spherical volume. All computations were performed in MATLAB 2017a (The MathWorks, Natick, Mass.).

Although full mutual impedance matrix measurements of the 9-channel coil were available, self-inductances and resistances were tuned manually to include the effect of the feed cables and amplifier-related parameters, such as stray inductances and drain source-on-resistance of the MOSFETs. Currents flowing through 9 coil elements were captured for the example cases to demonstrate the effect and feasibility of compensating for the mutual coupling between the channels. Current measurements were performed on a lab bench using a current probe (LFR06/6 Rogowski Current Waveform Transducer, Power Electronic Measurements Ltd., Nottingham, UK) and a digital oscilloscope (Agilent DSOS104A, Keysight Technologies, Santa Rosa, Calif.). Current waveforms were digitized at a rate of 1 MSa/s to filter out the higher frequency interference signals in the environment.

MRI experiments were conducted to image an orange as well as a home-built, homogenous cylindrical phantom with a diameter of 10 cm that consisted for $CuSO_4$ solution at a concentration of 15 mM/L. Central coronal slices (X-Z plane) were imaged using a gradient echo sequence with a field of view of 150 mm, an isotropic in-slice resolution of 1 mm and a slice thickness of 5 mm. For the orange and phantom images, the echo time/repetition time values were 10/100 ms and 7/300 ms, respectively. During the experiments, the system Z-gradients were turned off. Coil elements with current weightings optimized for a linear Z-gradient with a gradient strength of 13 mT/m were used as the prephaser and readout gradients. The prephaser and readout gradients took a total of 1150 microseconds and 2300 microseconds, respectively, including the rise and fall times of 500 microseconds. The maximum gradient amplifier voltage was limited to 40 V, and 80% of the actual specification of the amplifier increased the reliability of the system.

VI. Results

Figures 13A, 13B:
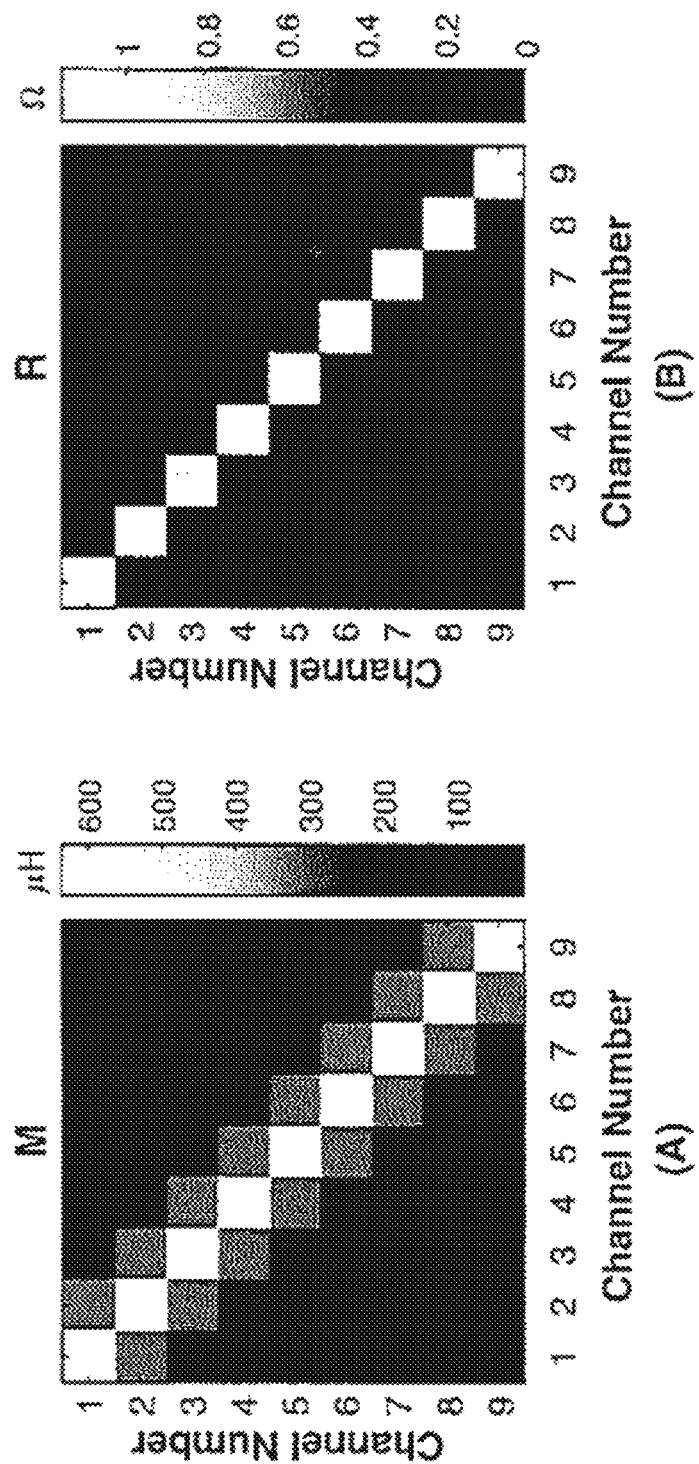
FIG. 13A represents the mutual inductance matrix, M, measured at 1 kHz, FIG. 13B represent DC resistance matrix, R, for 9 channel Z-gradient coils.
Figures 14A, 14B:
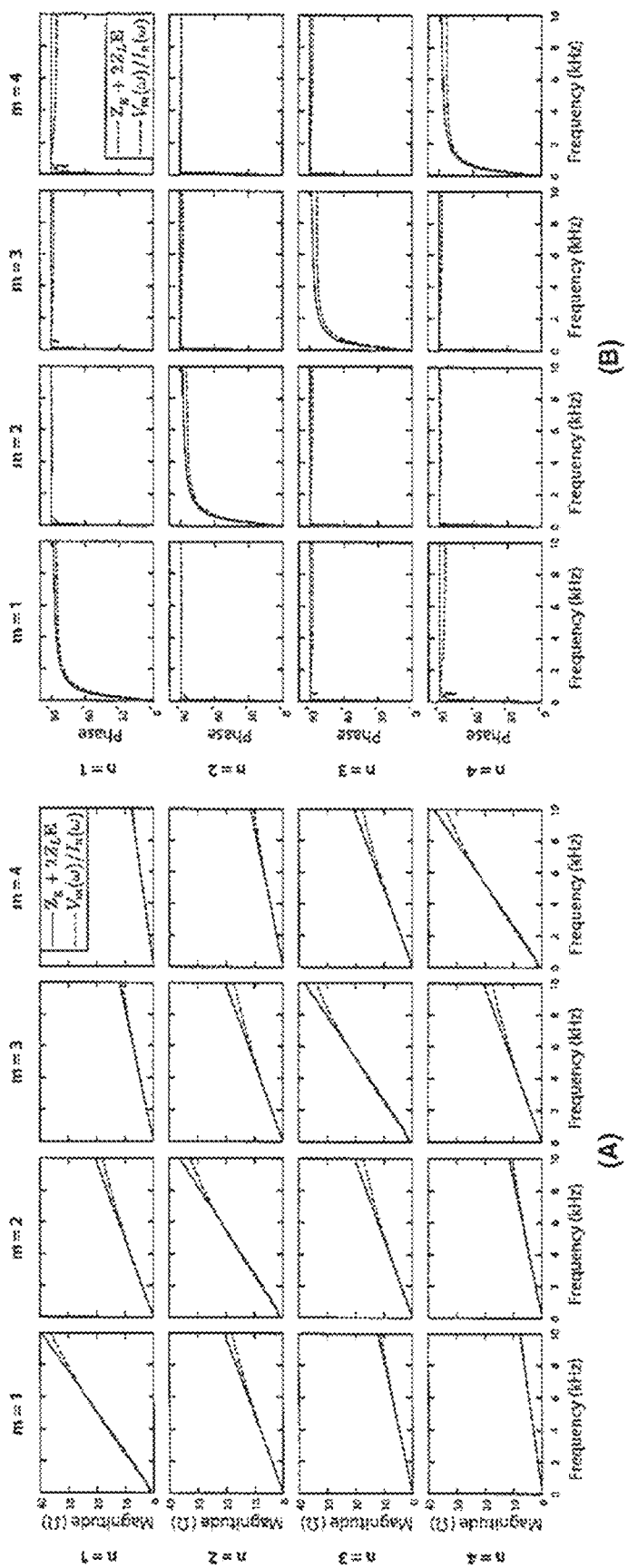
FIGS. 14A and 14B show, respectively, the magnitude and the phase for impedance matrices associated with a circuit model defined by Equations 20 assuming frequency-independent circuit elements and the calculated ratio of input voltage for the $m^{th}$ channel and output gradient current for the $n^{th}$ channel using impedance measurements of coil arrays with filters as a function of frequency.

Impedance measurements were performed to test the validity of the first-order lumped element circuit model in the low-pass frequency regime, which is expressed in Equation (2). For the first-order circuit model, inductance values measured at 1 kHz were assumed to be valid over the entire frequency range, and the resistance values measured at DC were used in the entire bandwidth. FIGS. 13A and 13B show the mutual inductance matrix (M) measured at 1 kHz and DC resistance matrix (R) of the gradient array coils. The mean value of the self-inductance of the coils was 608 µH and the mean value of the mutual inductance between the closest neighboring channels was 328 µH, which is more than the half of the coil's self-inductance. Mean value of the DC resistance was 1.13 Ohms. Furthermore, inductance and resistance of the filter inductor were measured as 36 µH and 40 mΩ, respectively, which was also included in the first-order lumped element circuit model. The entire frequency response of the first-order lumped element circuit model and impedance measurements are compared in FIGS. 14A and 14B. An impedance matrix of 4 representative channels is shown, and similar characteristics are present for the other channels. The impedance measurements can be used to analyze the assumptions made in Equation (2). Each coil element was modeled as an inductance and DC resistance by assuming that (1) there is no AC resistance; and (2) the self-resonance frequency of the coil is at much higher frequencies than the operating bandwidth of the amplifiers; the effect of the filter capacitor in Equation (1) was also neglected in Equation (2). Based on these assumptions, magnitude of the impedances increased linearly as a function of frequency with a slope proportional to the corresponding self or mutual inductance. These assumptions led to only a 1% deviation in the self-impedance on average at 5 kHz compared with the frequency response measurements. For frequencies greater than 5 kHz, the capacitive effects became notable, and the circuit model overestimated the self-impedance by nearly 12% for all channels as 10 kHz. The average phase error of the self-impedance was 4° at 10 kHz, which originated mostly from the increase in the AC resistance of the coil. Moreover, the circuit model also underestimated the amplitude of the mutual impedances at frequencies higher than 54 kHz due to capacitive effects. The average phase of the mutual impedance between any channel and the closes neighbor was 88° at 10 kHz. The phase of the mutual coupling may deviate from 90° due to the losses during the coupling. Therefore, the purely inductive mutual coupling assumption in Equation (2) causes a 2° phase error in the frequency response of the cross terms.

VII. Compensation of Mutual Coupling

In highly coupled gradient array coils, the actual current waveforms may significantly deviate from the desired current waveform if mutual coupling is not compensated during voltage calculations. The current error may be in different forms depending on the individual current amplitudes and waveforms for the mutually coupled coils. When the self-inductances of 2 coils are comparable and the mutual coupling coefficient is positive, the current flowing in the same direction, depending on their amplitudes, may lead to an undershoot and increase the rise time of the desired current for both channels because of the opposing induced voltage. Similarly, reverse directed currents flowing in 2 coils can cause an overcurrent in both channels. Moreover, even the direction of the current may change from the desired current direction if the induced voltage is greater than the applied voltages. In particular, the current waveforms of channels with relative lower desired current values may be significantly influenced by the channels with higher current values. When the mutual coupling is considered as discussed herein, desired current waveforms can be achieved with significantly less error.

Figures 15A, 15B, 15C:
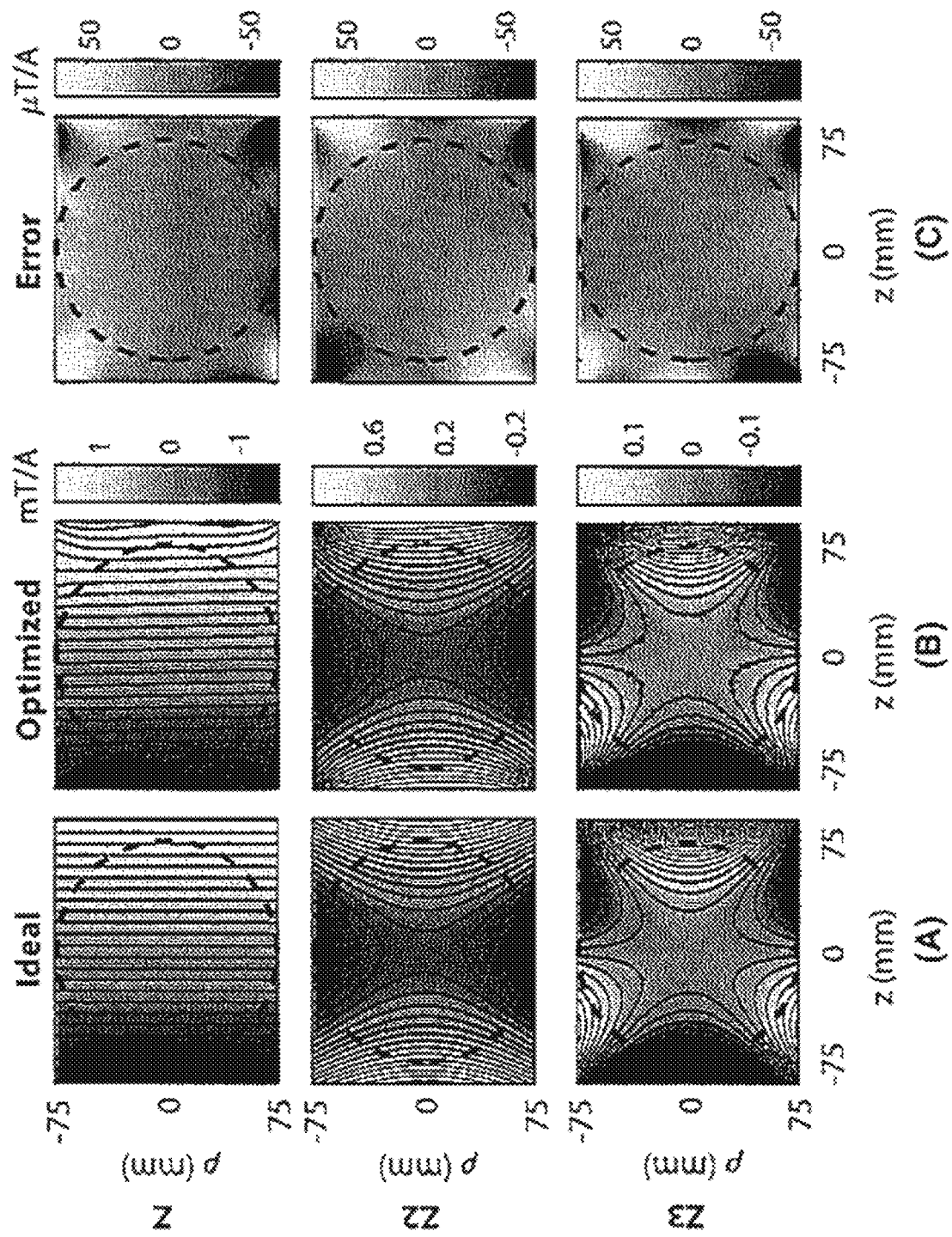
FIGS. 15A, 15B, and 15C show, respectively, magnetic field profiles for linear, second order and third-order magnetic fields.
Figure 16:
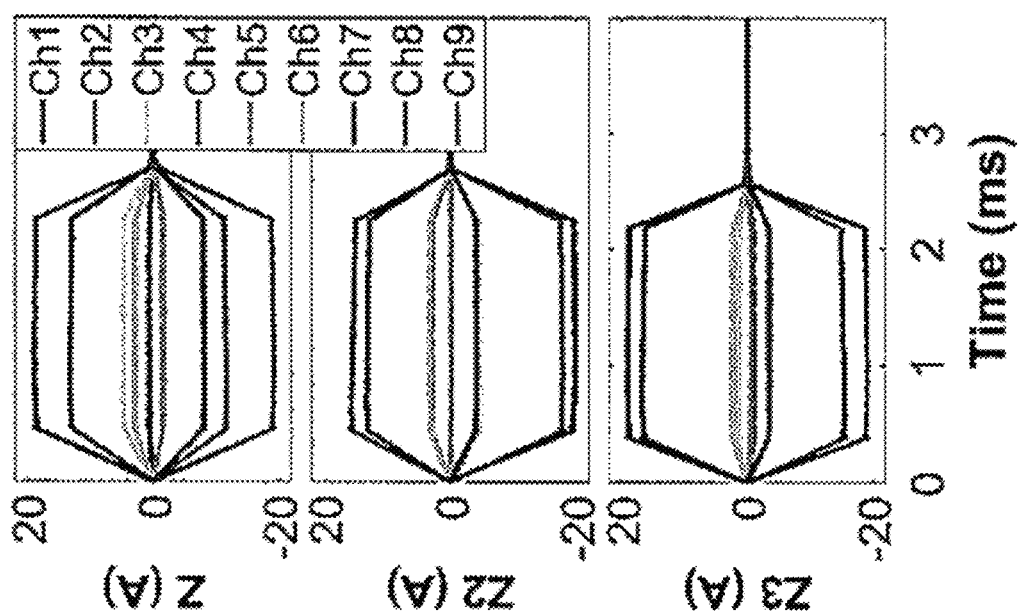
FIG. 16 shows current measurements for 9 coils (channels) of a gradient coil array for linear (Z), second-order (Z2), and third-order (Z3) magnetic field profiles.

In a series of experiments, the current weightings were optimized for 3 example magnetic field profiles, such as the Z, Z2, and Z3 field discussed above, using Equation (X). The optimal current weightings were scaled by 20 A when the amplifiers were driven at their maximum current limits. The target magnetic fields and the obtained magnetic field profiles using the superposition of the previously measured magnetic field map of each channel with optimized current weightings and error between the target and obtained magnetic field profiles are provided in FIGS. 15A, 15B, and 15C. The optimized linear Z-gradient field profile was also used as a readout gradient during the experiments. Furthermore, the minimum attainable rise time for the optimized current vectors were calculated using Equation (3) as 450 μs, 440 μs, and 380 μs for the Z, Z2, and Z3 fields, respectively. The user interface of the gradient amplifiers was programmed to provide trapezoidal current waveforms with minimum rise times. FIG. 16 shows the measured current waveforms passing through all gradient channels for the 3 field profiles. Small current drops were observed in the plateau region of some of the trapezoidal waveforms, most likely because of the supply voltage drops during high-demand use. Moreover, there was no feedback loop in the amplifiers to ensure that the output current accurately tracked the desired input signal. However, all current waveforms increased to the desired value in the minimum possible rise time, which confirms the circuit model in Eq. 2 and the analytical expression in Eq. 3.

For each desired current vector, required voltage for each channel was calculated using Eq. 2a. The required voltage for each channel can be decomposed into 3 different voltages such as $V_R$, $V_{self}$, and $V_{coupling}$ for interpretation purposes. $V_R$ represents the voltage required by the resistive part of the impedance matrix ($R^{total}$). $V_{self}$ is the voltage required by the self-inductance of each channel which only accounts for the diagonal entries of ($M^{total}$). Voltage induced on each coil due to the cross couplings is represented by the $V_{coulping}$, which is determined by the off-diagonal entries of $W^{total}$, current flowing through all other channels and rise/fall time of the trapezoidal waveform. In other words, $V_{coupling}$ represents the amount of voltage that should be considered to account for the couplings. Summation of these 3 decomposed voltages results in the applied voltage to the corresponding coil element.

Those having ordinary skill in the art will appreciate that various changes can be made to the above embodiments without departing from the scope of the invention.

The invention claimed is:

1. A system for magnetic resonance imaging (MRI), comprising:
   a gradient coil array comprising a plurality of independent coils distributed about an enclosure,
   a controller configured to actuate said plurality of coils to generate a magnetic field within a volume of interest,
   wherein said controller is configured to optimize a merit function defined for optimizing at least one feature of any of a magnetic field and an electric field generated by said coils so as to determine an optimal current vector containing current values for application to said coils,
   a plurality of amplifiers in communication with said controller, each of said amplifiers being electrically coupled to one of said independent coils,
   wherein said controller effects each of said amplifiers to apply a current defined by said current vector for a coil associated with said amplifier to said independent coils.

2. The system of claim 1, wherein said at least one feature comprises at least one of a magnetic field gradient generated by said independent coils in a volume of interest (VOI) and gradient field strength per unit current.

3. The system of claim 1, wherein said magnetic field gradient is defined along any of a longitudinal axis and a transverse axis of said independent coils.

4. The system of claim 2, wherein said controller is configured to maximize said gradient field strength while constraining the gradient field strength over said VOI to a value thereof at a reference location within said VOI.

5. The system of claim 4, wherein the controller is configured to solve the following linear optimization relation for maximizing the gradient field strength:

$$\min_I -G_{cent}^T I$$

$$\begin{bmatrix} (1-\alpha_0)1 G_{cent}^T - G^T \\ G^T - (1+\alpha_0)1 G_{cent}^T \end{bmatrix} I \le 0$$

$$\|I\|_\infty \le 1$$

wherein,
I is a column vector containing current values for application to the coils,
1 is a column vector of ones,
G is a matrix of normalized gradient strength values for a selected number of observation locations in each of said coils for unit coil currents,
$G_{cent}^T$ is a column vector containing normalized magnetic gradient strengths at the centers of said coils for unit coil currents, and
$\alpha_0$ represents a constraint imposed on the gradient field strength though said volume of interest.

6. The system of claim 1, wherein said at least one feature comprises gradient field linearity.

7. The system of claim 6, wherein said controller is configured to optimize said gradient field linearity by minimizing gradient field strength deviation at a plurality of locations within the VOI relative to a gradient field strength at a reference location within said VOI.

8. The system of claim 7, wherein said controller is configured to optimize said gradient field linearity by solving the following relations:

$$\min_{I,\varepsilon} [0\ 1]\begin{bmatrix}I\\\varepsilon\end{bmatrix}$$

$$\begin{bmatrix}G^T & -1\\-G^T & -1\end{bmatrix}\begin{bmatrix}I\\\varepsilon\end{bmatrix} \leq \begin{bmatrix}1\\-1\end{bmatrix}$$

$$[G_{cent}^T\ 0]\begin{bmatrix}I\\\varepsilon\end{bmatrix} = 1$$

wherein,
I is a column vector containing current values for application to the coils,
G is a matrix of normalized gradient strength values for a selected number of observation locations in each of said coils for unit coil currents,
$G_{cent}^T$ is a column vector containing normalized magnetic gradient strengths at the centers of said coils for unit coil currents, and
$\varepsilon$ is a normalization variable providing an upper limit for the linearity error.

9. The system of claim 1, wherein said controller is configured to maximize magnetic field slew rate by minimizing a rise time associated with said current vector for a unit (1 V) amplifier voltage limit.

10. The system of claim 9, wherein said controller is configured to minimize said rise time by minimizing a maximum value of the rise time associated with said coils.

11. The system of claim 10, wherein the controller is configured to minimize the rise time ($\Delta t_{min}$) by solving the following relations:

$$\min_I \Delta t_{min} = \min_I \|MI\|_\infty$$

$$|(G^T - 1G_{cent}^T)I| \leq \alpha_0 |1G_{cent}^T I|$$

$$G_{cent}^T I = 1,$$

wherein,
I is a column vector containing current values for application to the coils,
M is a matrix containing elements corresponding to self and mutual inductive couplings of said plurality of coils,
G is a matrix of normalized gradient strength values for a selected number of observation locations in each of said coils for unit coil currents, and
$G_{cent}^T$ is a column vector containing normalized magnetic gradient strengths at the centers of said coils for unit coil currents.

12. The system of claim 1, wherein said at least one feature comprises a square of the norm of the current vector within a volume of interest (VOI).

13. The system of claim 12, wherein said controller is configured to solve the following relations for minimizing the square of the current norm:

$$\min_I \|I\|_2^2$$

$$\begin{bmatrix}(1-\alpha_0)1G_{cent}^T - G^T\\G^T - (1+\alpha_0)1G_{cent}^T\end{bmatrix} I \leq 0$$

$$G_{cent}^T I = 1,$$

wherein,
I is a column vector containing current values for application to the coils,
M is a matrix containing elements corresponding to self and mutual inductive couplings of said plurality of coils,
G is a matrix of normalized gradient strength values for a selected number of observation locations in each of said coils for unit coil currents, and
$G_{cent}^T$ is a column vector containing normalized magnetic gradient strengths at the centers of said coils for unit coil currents, and
$\alpha_0$ represents a constraint imposed on the gradient field strength though said volume of interest.

14. The system of claim 1, wherein said controller is configured to minimize maximum amplitude of a vector B-field within a volume containing a volume of interest (VOI) while concurrently maximizing magnetic field strength in said VOI so as to reduce risk of peripheral nerve stimulation (PNS).

15. The system of claim 14, wherein said maximum amplitude of the vector B-field ($B_{max}$) is defined in accordance with the following relation:

$$B_{max} = \max_r |\Sigma_{i=1}^N B_i(r) I_i|,$$

wherein,
$B_i(r)$ represents three-dimensional magnetic field vector associated with the $i^{th}$ coil at a plurality of locations (r) in said volume of interest,
$I_i$ is the current associated with the $i^{th}$ coil.

16. The system of claim 15, wherein said controller is configured to solve the following relations to minimize the maximum amplitude of the vector B-field:

$$\min_I B_{max}$$

$$\begin{bmatrix}(1-\alpha_0)1G_{cent}^T - G^T\\G^T - (1+\alpha_0)1G_{cent}^T\end{bmatrix} I \leq 0$$

$$G_{cent}^T I = 1,$$

wherein,
I is a column vector containing current values for application to the coils, M is a matrix containing elements corresponding to self and mutual inductive couplings of said plurality of coils, G is a matrix of normalized gradient strength values for a selected number of observation locations in each of said coils for unit coil currents, and $G_{cent}^T$ is a column vector containing normalized magnetic gradient strengths at the centers of said coils for unit coil currents.

$\alpha_0$ represents a constraint imposed on the gradient field strength though said volume of interest.

17. The system of claim 1, wherein said controller is configured to obtain said current vector by constraining maximum of electric field generated in a volume containing a volume of interest below a threshold so as to inhibit peripheral nerve stimulation (PNS) of a patient disposed at least partially in said volume.

18. The system of claim 17, wherein said controller determines said threshold by utilizing a neural activation model.

19. The system of claim 1, wherein said controller is configured to concurrently optimize two or more of the following features so as to reduce risk of peripheral nerve stimulation (PNS): gradient field strength per unit current, gradient field linearity, magnetic field slew rate, the square of the norm of current vector, maximum amplitude of vector B-field, and maximum amplitude of vector E-field, heating and acoustic energy.

20. The system of claim 1, wherein said controller is configured to determine said current vector so as to generate diffusion encoding magnetic field gradients suitable for obtaining a diffusion image of at least a portion of a subject's tissue disposed in a volume of interest, wherein said controller is configured to optimize the magnetic field gradient strength so as to decrease diffusion encoding duration, thereby increasing signal-to-noise ratio of DWI.

* * * * *